United States Patent
Yeh et al.

(10) Patent No.: US 12,490,497 B2
(45) Date of Patent: Dec. 2, 2025

(54) METAL GATE PATTERNING

(71) Applicant: Taiwan Semiconductor Manufacturing Company, Ltd., Hsinchu (TW)

(72) Inventors: Tefu Yeh, Kaohsiung (TW); Cheng-Chieh Tu, Hsinchu (TW); Hao-Hsin Chen, Keelung (TW); Jo-Chun Hung, Hsinchu (TW); Ying-Liang Chuang, Hsinchu (TW); Ming-Hsi Yeh, Hsinchu (TW); Kuo-Bin Huang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 419 days.

(21) Appl. No.: 18/163,986

(22) Filed: Feb. 3, 2023

(65) Prior Publication Data

US 2024/0222196 A1 Jul. 4, 2024

Related U.S. Application Data

(60) Provisional application No. 63/477,608, filed on Dec. 29, 2022.

(51) Int. Cl.
*H10D 84/03* (2025.01)
*H10D 30/43* (2025.01)
(Continued)

(52) U.S. Cl.
CPC ........... *H10D 84/038* (2025.01); *H10D 30/43* (2025.01); *H10D 30/6735* (2025.01);
(Continued)

(58) Field of Classification Search
CPC .. H10D 84/038; H10D 30/43; H10D 30/6735; H10D 62/121; H10D 84/0177; H10D 84/85; H10D 64/667; H10D 64/691
See application file for complete search history.

(56) References Cited

U.S. PATENT DOCUMENTS 10,177,148 B2   1/2019  Ha et al.
11,264,289 B2   3/2022  Smith et al.
(Continued)

FOREIGN PATENT DOCUMENTS

CN    113113361 A  *  7/2021  ......... H10D 30/6757
TW    202114065 A     4/2021
TW    202236535 A     9/2022

*Primary Examiner* — S M Sohel Imtiaz
(74) *Attorney, Agent, or Firm* — Ingrassia Fisher & Lorenz, LLP

(57) ABSTRACT

Disclosed is a method of forming gate structures for n-type and p-type transistors. The method includes: forming an interfacial layer and high-K (HK) dielectric layer for the gate structures; forming an n-type metal layer over the HK dielectric layer; forming a hard capping layer over the n-type metal layer while simultaneously strengthening the HK dielectric layer by fluorine passivation; patterning photo resist (PR) material over the hard capping layer that exposes a portion of the hard capping layer over the p-type transistor; removing the n-type metal layer and the hard capping layer over the p-type transistor via wet etching operations using high selectivity chemicals that are highly selective to the hard capping layer and the n-type metal layer; removing the patterned PR material while insulating, by the hard capping layer, gate structures from aluminum oxidation; and forming a p-type metal layer over the hard capping layer and the p-type transistor.

20 Claims, 22 Drawing Sheets

(51) Int. Cl.
*H10D 30/67* (2025.01)
*H10D 62/10* (2025.01)
*H10D 84/01* (2025.01)
*H10D 84/85* (2025.01)

(52) U.S. Cl.
CPC ....... *H10D 62/121* (2025.01); *H10D 84/0177* (2025.01); *H10D 84/85* (2025.01)

(56) References Cited

U.S. PATENT DOCUMENTS

| | | | |
|---|---|---|---|
| 2017/0110553 A1* | 4/2017 | Zhou | H10D 30/024 |
| 2018/0040620 A1* | 2/2018 | Ha | H10D 86/011 |
| 2020/0091149 A1* | 3/2020 | Lee | H01L 21/3065 |
| 2021/0013111 A1* | 1/2021 | Smith | H10D 84/0181 |
| 2021/0050425 A1* | 2/2021 | Pandey | H01L 21/28088 |
| 2021/0098303 A1* | 4/2021 | Lai | H10D 84/0158 |
| 2021/0399102 A1* | 12/2021 | Lee | H10D 84/038 |
| 2022/0148924 A1* | 5/2022 | Smith | H10D 84/0181 |
| 2022/0231018 A1* | 7/2022 | Lee | H10D 30/6735 |
| 2022/0238682 A1* | 7/2022 | Bao | H10D 64/662 |
| 2022/0310405 A1* | 9/2022 | Wang | C23C 14/48 |
| 2022/0367279 A1* | 11/2022 | Lai | H01L 21/28088 |

* cited by examiner

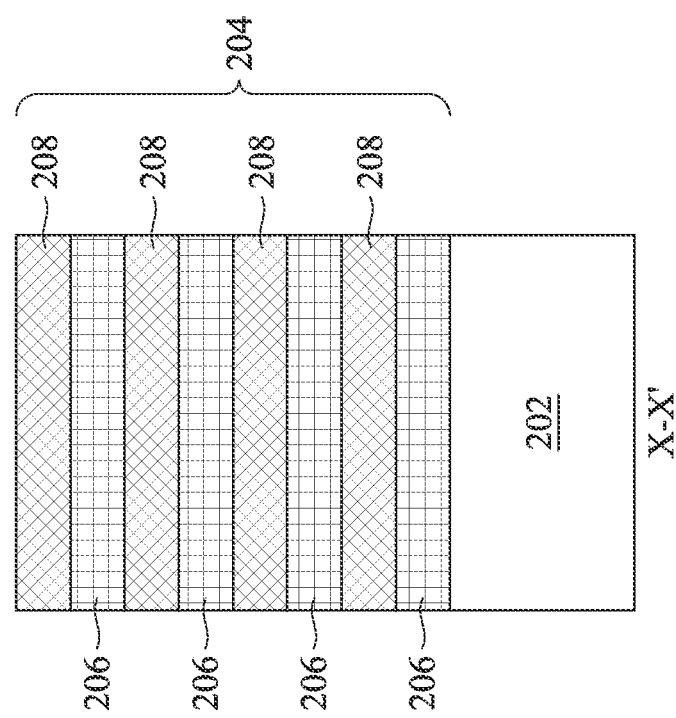
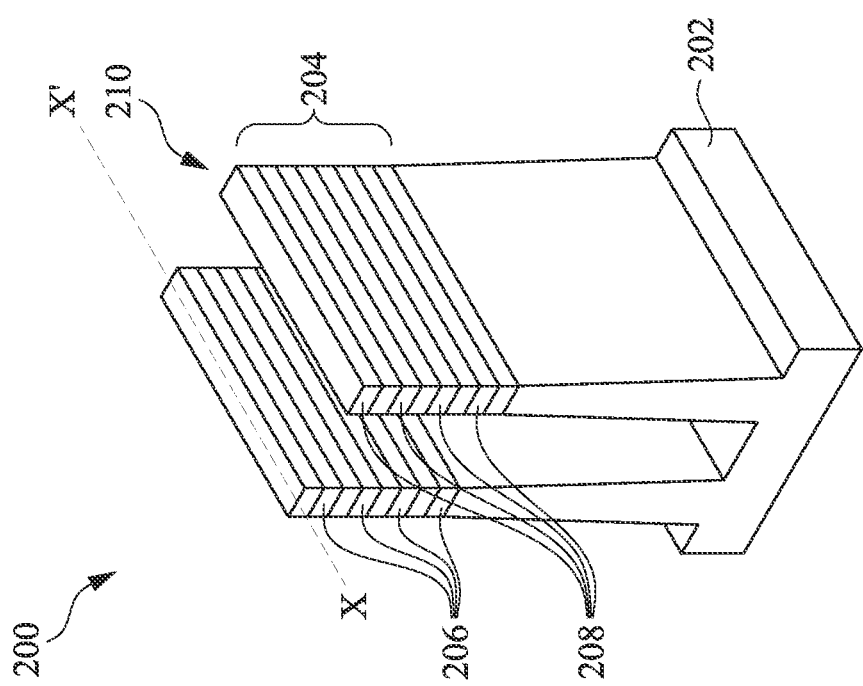
Fig. 2B
Fig. 2A

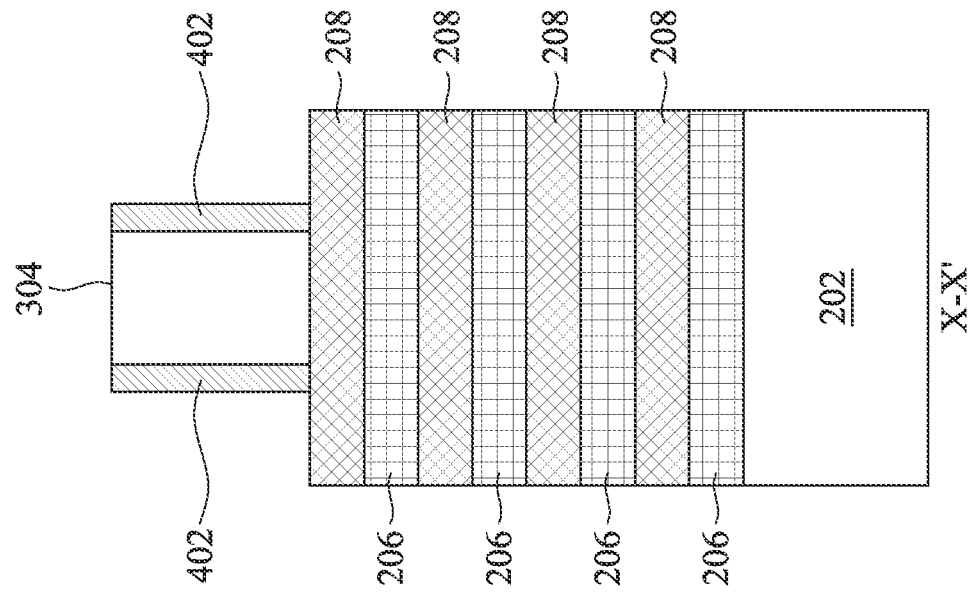
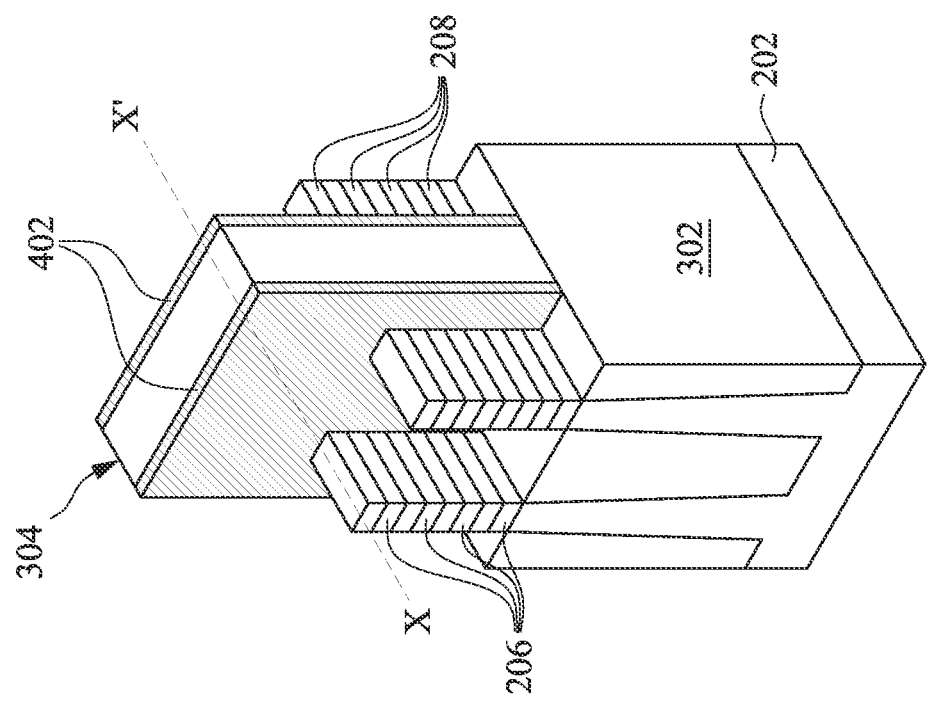
Fig. 5B
Fig. 5A

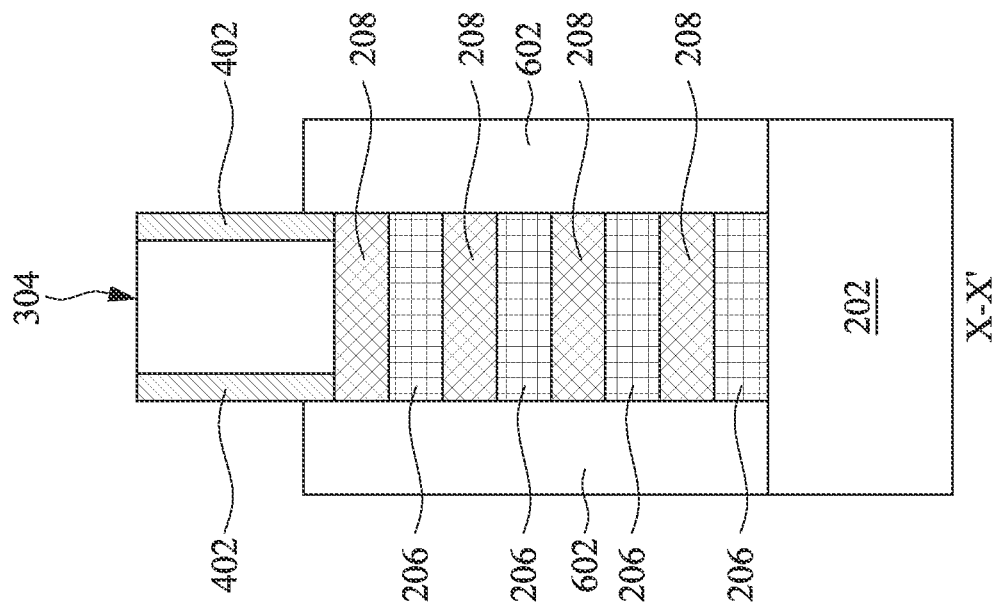
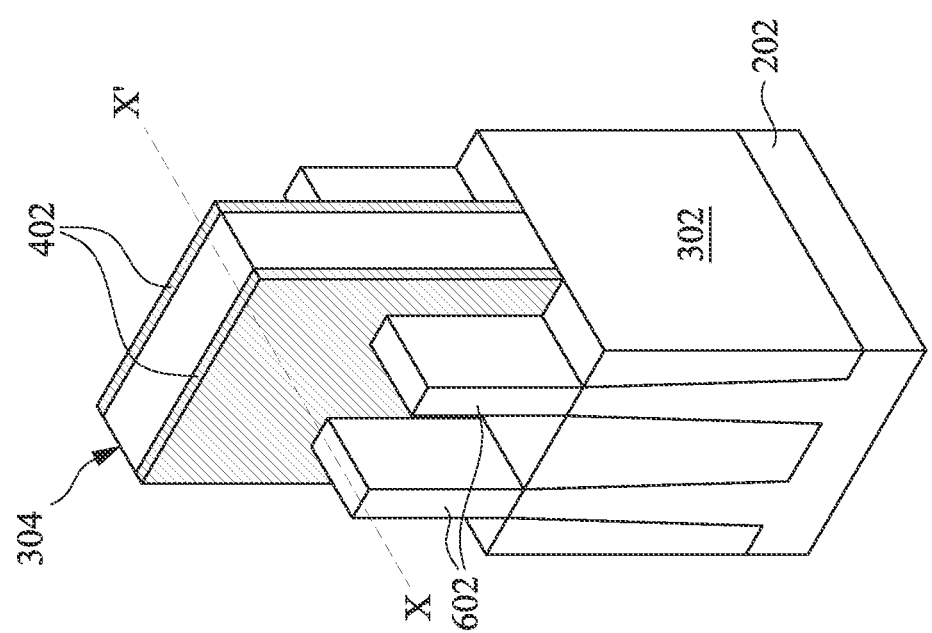
Fig. 6B
Fig. 6A

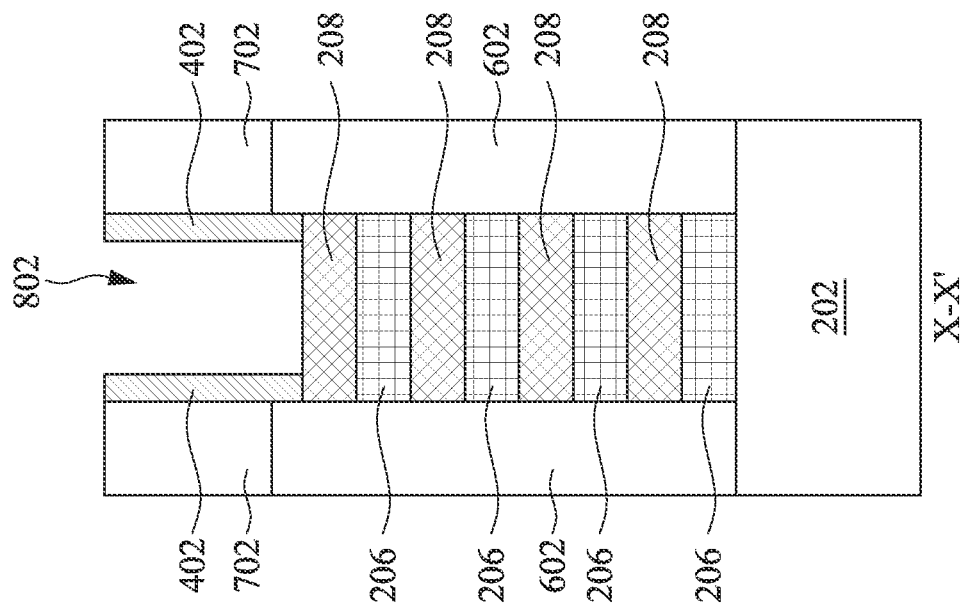
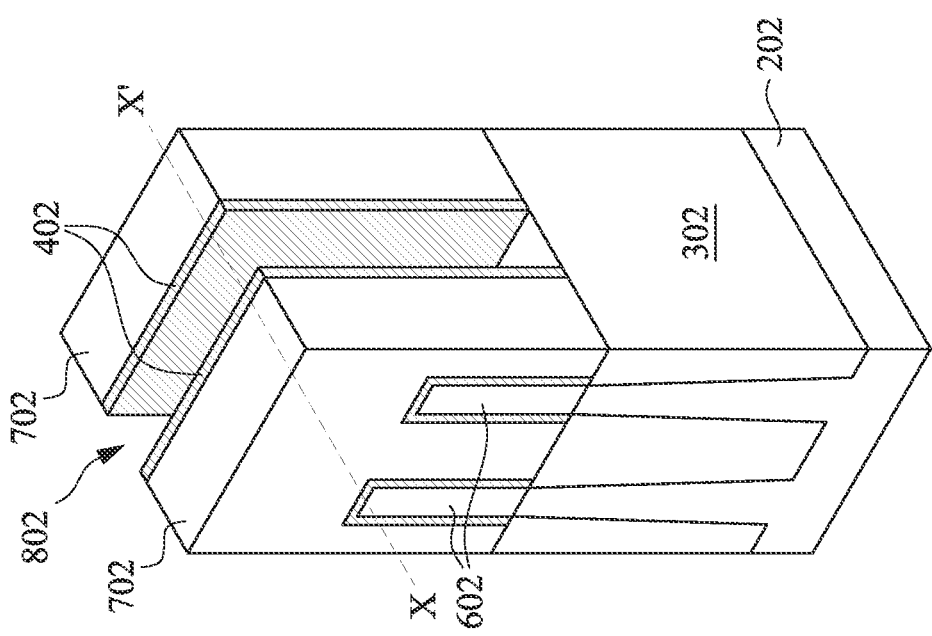
Fig. 8B
Fig. 8A

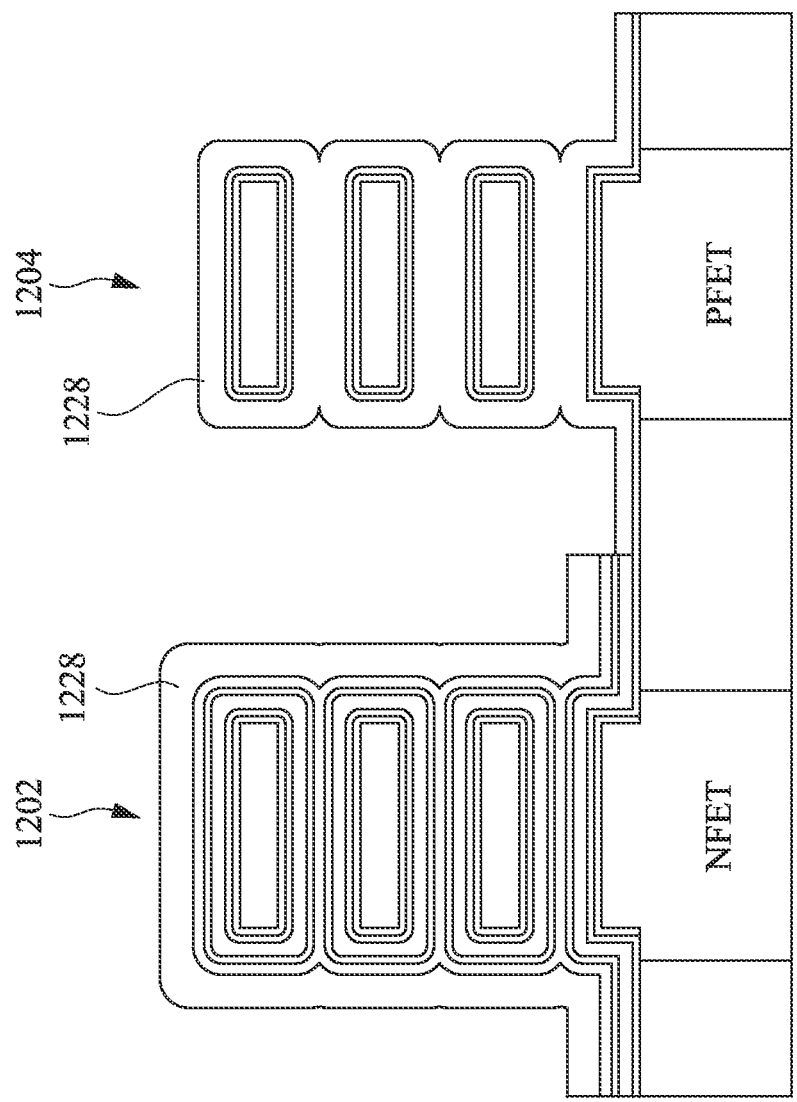

METAL GATE PATTERNING

CROSS-REFERENCE TO RELATED APPLICATIONS

This application claims the benefit of U.S. Provisional Patent Application No. 63/477,608, filed Dec. 29, 2022, which is incorporated herein by reference in its entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum feature sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A, 3A, 4A, 5A, 6A, 7A, 8A, 9A and 10A, are isometric views of an example semiconductor device, in accordance with some embodiments.

FIGS. 2B, 3B, 4B, 5B, 6B, 7B, 8B, 9B and 10B are corresponding cross-sectional side views of an embodiment of the example semiconductor device along a first cut X-X', in accordance with some embodiments.

FIGS. 12A-12K are diagrams depicting enlarged views of example semiconductor gate structures at various stages of fabrication, in accordance with some embodiments.

DETAILED DESCRIPTION

Figure 1:
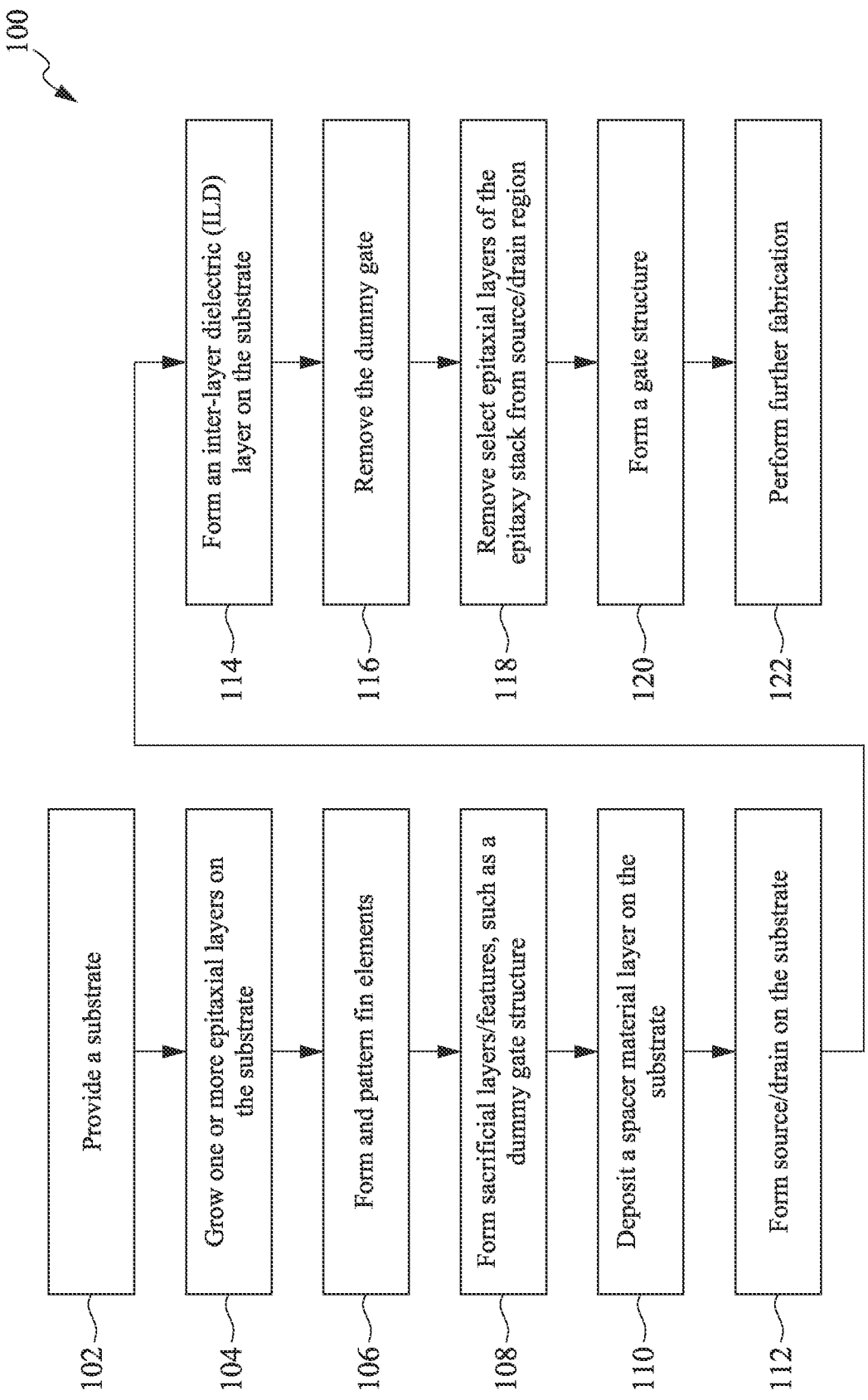
FIG. 1 is a flow chart depicting an example method of semiconductor fabrication including fabrication of multi-gate devices, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting.

For the sake of brevity, conventional techniques related to conventional semiconductor device fabrication may not be described in detail herein. Moreover, the various tasks and processes described herein may be incorporated into a more comprehensive procedure or process having additional functionality not described in detail herein. Various processes in the fabrication of semiconductor devices are well-known and so, in the interest of brevity, many conventional processes will only be mentioned briefly herein or will be omitted entirely without providing the well-known process details. As will be readily apparent to those skilled in the art upon a complete reading of the disclosure, the structures disclosed herein may be employed with a variety of technologies, and may be incorporated into a variety of semiconductor devices and products. Further, it is noted that semiconductor device structures include a varying number of components and that single components shown in the illustrations may be representative of multiple components.

Furthermore, spatially relative terms, such as "over", "overlying", "above", "upper", "top", "under", "underlying", "below", "lower", "bottom", and the like, may be used herein for ease of description to describe one element's or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When a spatially relative term, such as those listed above, is used to describe a first element with respect to a second element, the first element may be directly on the other element, or intervening elements or layers may be present. When an element or layer is referred to as being "on" another element or layer, it is directly on and in contact with the other element or layer.

In addition, the present disclosure may repeat reference numerals and/or letters in the various examples. This repetition is for the purpose of simplicity and clarity and does not in itself dictate a relationship between the various embodiments and/or configurations discussed.

It is noted that references in the specification to "one embodiment," "an embodiment," "an example embodiment," "exemplary," "example," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to affect such feature, structure, or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

Various embodiments are discussed herein in a particular context, namely, for forming a semiconductor structure that includes a fin-like field-effect transistor (FinFET) device. The semiconductor structure, for example, may be a complementary metal-oxide-semiconductor (CMOS) device including a P-type metal-oxide-semiconductor (PMOS) FinFET device and an N-type metal-oxide-semiconductor (NMOS) FinFET device. Embodiments will now be described with respect to particular examples including FinFET manufacturing processes. Embodiments, however, are not limited to the examples provided herein, and the ideas may be implemented in a wide array of embodiments. Thus, various embodiments may be applied to other semiconductor devices/processes, such as planar transistors, and the like. Further, some embodiments discussed herein are discussed in the context of devices formed using a gate-last process. In other embodiments, a gate-first process may be used.

While the figures illustrate various embodiments of a semiconductor device, additional features may be added in the semiconductor device depicted in the Figures and some of the features described below can be replaced, modified, or eliminated in other embodiments of the semiconductor device.

Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

It is also noted that the present disclosure presents embodiments in the form of multi-gate transistors. Multi-gate transistors include those transistors whose gate structures are formed on at least two-sides of a channel region. These multi-gate devices may include a P-type metal-oxide-semiconductor device or an N-type metal-oxide-semiconductor multi-gate device. Specific examples may be presented and referred to herein as FinFET, on account of their fin-like structure. Also presented herein are embodiments of a type of multi-gate transistor referred to as a gate-all-around (GAA) device. A GAA device includes any device that has its gate structure, or portion thereof, formed on 4-sides of a channel region (e.g., surrounding a portion of a channel region). Devices presented herein also include embodiments that have channel regions disposed in nanowire channel(s), bar-shaped channel(s), and/or other suitable channel configuration. Presented herein are embodiments of devices that may have one or more channel regions (e.g., nanowires) associated with a single, contiguous gate structure. However, one of ordinary skill would recognize that the teaching can apply to a single channel (e.g., single nanowire) or any number of channels. One of ordinary skill may recognize other examples of semiconductor devices that may benefit from aspects of the present disclosure.

FIG. 1 is a flow chart depicting an example method 100 of semiconductor fabrication including fabrication of multi-gate devices. As used herein, the term "multi-gate device" is used to describe a device (e.g., a semiconductor transistor) that has at least some gate material disposed on multiple sides of at least one channel of the device. In some examples, the multi-gate device may be referred to as a GAA device having gate material disposed on at least four sides of at least one channel of the device. The channel region may be referred to as a "nanowire," which as used herein includes channel regions of various geometries (e.g., cylindrical, bar-shaped) and various dimensions.

FIG. 1 is described in conjunction with FIGS. FIGS. 2A-2B, 3A-3B, 4A-4B, 5A-5B, 6A-6B, 7A-7B, 8A-8B, 9A-9B and 10A-10B, which illustrate a semiconductor device 200 or structure at various stages of fabrication in accordance with some embodiments. The method 100 is merely an example and is not intended to limit the present disclosure beyond what is explicitly recited in the claims. Additional steps may be provided before, during, and after method 100, and some of the steps described can be moved, replaced, or eliminated for additional embodiments of method 100. Additional features may be added in the semiconductor device 200 depicted in the figures, and some of the features described below can be replaced, modified, or eliminated in other embodiments.

As with the other method embodiments and exemplary devices discussed herein, it is understood that parts of the semiconductor devices may be fabricated by semiconductor technology process flow, and thus some processes are only briefly described herein. Further, the exemplary semiconductor devices may include various other devices and features, such as other types of devices such as additional transistors, bipolar junction transistors, resistors, capacitors, inductors, dials, fuses, and/or other logic devices, etc., but is simplified for better understanding of concepts of the present disclosure. In some embodiments, exemplary devices include a plurality of semiconductor devices (e.g., transistors), including PFETs, NFETs, etc., which may be interconnected. Moreover, it is noted that the process steps of method 100, include any descriptions given with reference to the figures, as with the remainder of the method and exemplary figures provided in this disclosure, are merely exemplary and are not intended to be limiting beyond what is specifically recited in the claims that follow.

FIGS. 2A, 3A, 4A, 5A, 6A, 7A, 8A, 9A and 10A, are isometric views of an example semiconductor device 200 and FIGS. 2B, 3B, 4B, 5B, 6B, 7B, 8B, 9B and 10B are corresponding cross-sectional side views of an embodiment of the example semiconductor device 200 along a first cut X-X' in an example fabrication process in accordance with some embodiments. In some figures, some reference numbers of components or features illustrated therein may be omitted to avoid obscuring other components or features; this is for ease of depicting the figures.

At block 102, the example method 100 includes providing a substrate 202. Referring to the example of FIGS. 2A and 2B, in an embodiment of block 102, a substrate 202 is provided. In some embodiments, the substrate 202 may be a semiconductor substrate such as a silicon substrate. The substrate 202 may include various layers, including conductive or insulating layers formed on a semiconductor substrate. The substrate 202 may include various doping configurations depending on design requirements. For example, different doping profiles (e.g., n wells, p wells) may be formed on the substrate 202 in regions designed for different device types (e.g., n-type field effect transistors (NFET), p-type field effect transistors (PFET)). The suitable doping may include ion implantation of dopants and/or diffusion processes. The substrate 202 has isolation features (e.g., shallow trench isolation (STI) features) interposing the regions providing different device types. The substrate 202 may also include other semiconductors such as germanium, silicon carbide (SiC), silicon germanium (SiGe), or diamond. Alternatively, the substrate 202 may include a compound semiconductor and/or an alloy semiconductor. Further, the substrate 202 may optionally include an epitaxial layer (epi-layer), may be strained for performance enhancement, may include a silicon-on-insulator (SOI) structure, and/or have other suitable enhancement features.

Returning to FIG. 1, the method 100 then proceeds to block 104 where one or more epitaxial layers are grown on the substrate. With reference to the example of FIGS. 2A and 2B, in an embodiment of block 104, an epitaxial stack 204 is formed over the substrate 202. The epitaxial stack 204 includes epitaxial layers 206 of a first composition interposed by epitaxial layers 208 of a second composition. The first and second composition can be different. In an embodiment, the epitaxial layers 206 are SiGe and the epitaxial layers 208 are silicon (Si). However, other embodiments are possible including those that provide for a first composition and a second composition having different oxidation rates and/or etch selectivity. In some embodiments, the epitaxial layer 206 includes SiGe and where the epitaxial layer 208 includes Si, the Si oxidation rate of the epitaxial layer 208 is less than the SiGe oxidation rate of the epitaxial layer 206.

The epitaxial layers 208 or portions thereof may form a channel region of the multi-gate device 200. For example, the epitaxial layers 208 may be referred to as "nanowires" used to form a channel region of a multi-gate device 200 such as a GAA device. These "nanowires" are also used to form portions of the source/drain regions of the multi-gate device 200 as discussed below. Source/drain region(s) may refer to a source or a drain, individually or collectively dependent upon the context. Again, as the term is used herein, "nanowires" refers to semiconductor layers that are cylindrical in shape as well as other configurations such as, bar-shaped. The use of the epitaxial layers 208 to define a channel or channels of a device is further discussed below.

It is noted that four (4) layers of each of epitaxial layers 206 and 208 are illustrated in FIGS. 2A and 2B, this is for illustrative purposes only and not intended to be limiting beyond what is specifically recited in the claims. It can be appreciated that any number of epitaxial layers can be formed in the epitaxial stack 204; the number of layers depending on the desired number of channel regions for the device 200. In some embodiments, the number of epitaxial layers 208 is between 2 and 10.

In some embodiments, the epitaxial layer 206 has a thickness range of about 2-6 nanometers (nm). The epitaxial layers 206 may be substantially uniform in thickness. In some embodiments, the epitaxial layer 208 has a thickness range of about 6-12 nm. In some embodiments, the epitaxial layers 208 of the stack are substantially uniform in thickness. As described in more detail below, the epitaxial layer 208 may serve as channel region(s) for a subsequently-formed multi-gate device and its thickness chosen based on device performance considerations. The epitaxial layer 206 may serve to define a gap distance between adjacent channel region(s) for a subsequently-formed multi-gate device and its thickness chosen based on device performance considerations.

By way of example, epitaxial growth of the layers of the stack 204 may be performed by a molecular beam epitaxy (MBE) process, a metalorganic chemical vapor deposition (MOCVD) process, and/or other suitable epitaxial growth processes. In some embodiments, the epitaxially grown layers such as, the layers 208 include the same material as the substrate 202. In some embodiments, the epitaxially grown layers 206, 208 include a different material than the substrate 202. As stated above, in at least some examples, the epitaxial layer 206 includes an epitaxially grown silicon germanium (SiGe) layer and the epitaxial layer 208 includes an epitaxially grown silicon (Si) layer. Alternatively, in some embodiments, either of the epitaxial layers 206, 208 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the epitaxial layers 206, 208 may be chosen based on providing differing oxidation, etch selectivity properties. In various embodiments, the epitaxial layers 206, 208 are substantially dopant-free (i.e., having an extrinsic dopant concentration from about 0 $cm^{-3}$ to about $1 \times 10^{17}$ $cm^{-3}$), where for example, no intentional doping is performed during the epitaxial growth process.

The method 100 then proceeds to block 106 where fin elements are patterned and formed. With reference to the example of FIG. 2A, in an embodiment of block 106, a plurality of fin elements 210 extending from the substrate 202 are formed. In various embodiments, each of the fin elements 210 includes a substrate portion formed from the substrate 202, portions of each of the epitaxial layers of the epitaxial stack including epitaxial layers 206 and 208.

The fin elements 210 may be fabricated using suitable processes including photolithography and etch processes. The photolithography process may include forming a photoresist layer over the substrate 202 (e.g., over the epi stack 204), exposing the resist to a pattern, performing post-exposure bake processes, and developing the resist to form a masking element including the resist. In some embodiments, patterning the resist to form the masking element may be performed using an electron beam (e-beam) lithography process. The masking element may then be used to protect regions of the substrate 202, and layers 204 formed thereupon, while an etch process forms trenches in unprotected regions through masking layer(s) such as hard mask, thereby leaving the plurality of extending fins. The trenches may be etched using a dry etch (e.g., reactive ion etching), a wet etch, and/or other suitable processes. The trenches may be filled with dielectric material forming, for example, shallow trench isolation features interposing the fins.

In some embodiments, the dielectric layer may include SiO2, silicon nitride, silicon oxynitride, fluorine-doped silicate glass (FSG), a low-k dielectric, combinations thereof, and/or other suitable materials. In various examples, the dielectric layer may be deposited by a chemical vapor deposition (CVD) process, a sub atmospheric CVD (SACVD) process, a flowable CVD process, an atomic layer deposition (ALD) process, a physical vapor deposition (PVD) process, and/or other suitable process. In some embodiments, after deposition of the dielectric layer, the device 200 may be annealed, for example, to improve the quality of the dielectric layer. In some embodiments, the dielectric layer (and subsequently formed STI features 302) may include a multi-layer structure, for example, having one or more liner layers.

In some embodiments of forming the isolation (STI) features, after deposition of the dielectric layer, the deposited dielectric material is thinned and planarized, for example by a chemical mechanical polishing (CMP) process. The CMP process may planarize the top surface thereby forming STI features 302. The STI features 302 interposing the fin elements are recessed. Referring to the example of FIG. 3A, the STI features 302 are recessed providing the fins 210 extending above the STI features 302. In some embodiments, the recessing process may include a dry etching process, a wet etching process, and/or a combination thereof. In some embodiments, a recessing depth is controlled (e.g., by controlling an etching time) so as to result in a desired height 'H' of the exposed upper portion of the fin elements 210. The height 'H' exposes each of the layers of the epitaxy stack 204.

Numerous other embodiments of methods to form the fins on the substrate may also be used including, for example, defining the fin region (e.g., by mask or isolation regions) and epitaxially growing the epitaxial stack 204 in the form of the fin. In some embodiments, forming the fins may include a trim process to decrease the width of the fins. The trim process may include wet or dry etching processes.

The method 100 then proceeds to block 108 where sacrificial layers/features are formed and in particular, a dummy gate structure. While the present discussion is directed to a replacement gate process whereby a dummy gate structure is formed and subsequently replaced, other configurations may be possible.

Figure 3B:
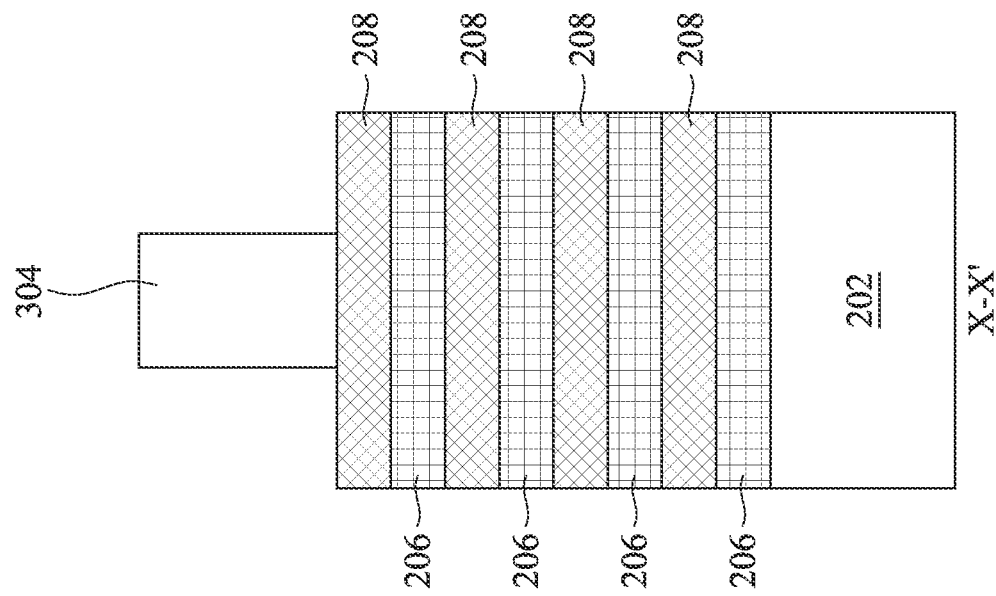
Figure 3A:
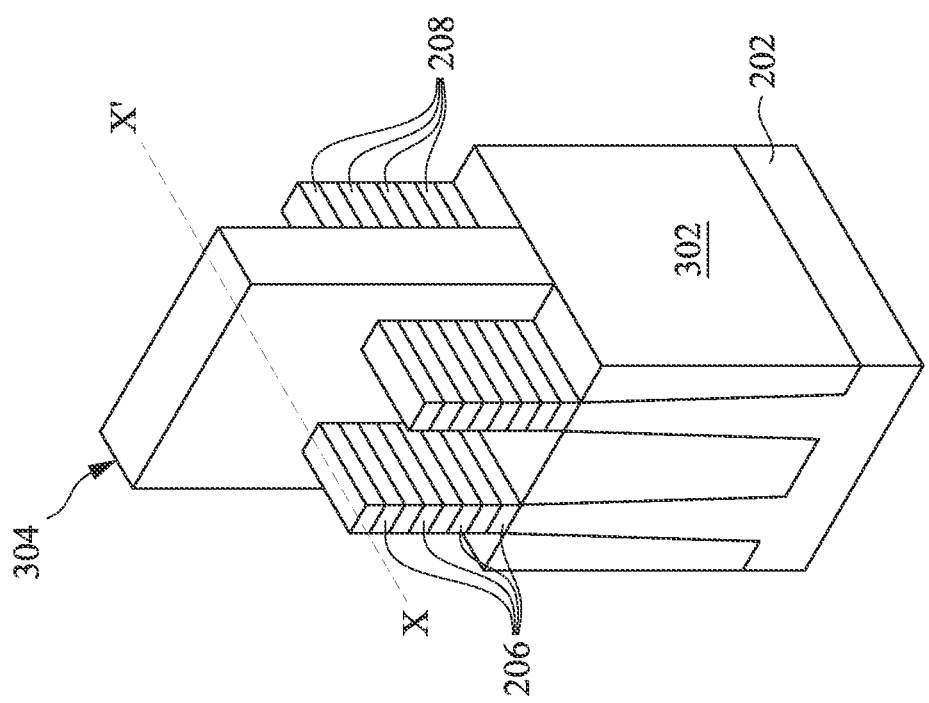

With reference to FIGS. 3A and 3B, a gate stack 304 is formed. In an embodiment, the gate stack 304 is a dummy (sacrificial) gate stack that is subsequently removed as discussed with reference to block 108 of the method 100.

Thus, in some embodiments using a gate-last process, the gate stack 304 is a dummy gate stack and will be replaced by the final gate stack at a subsequent processing stage of the device 200. In particular, the gate stack 304 may be replaced at a later processing stage by a high-K dielectric layer (HK) and metal gate electrode (MG) as discussed below. In some embodiments, the gate stack 304 is formed over the substrate 202 and is at least partially disposed over the fin elements 210. The portion of the fin elements 210 underlying the gate stack 304 may be referred to as the channel region. The gate stack 304 may also define a source/drain region of the fin elements 210, for example, the regions of the fin and epitaxial stack 204 adjacent and on opposing sides of the channel region.

In some embodiments, the gate stack 304 includes the dielectric layer and a dummy electrode layer. The gate stack 304 may also include one or more hard mask layers (e.g., oxide, nitride). In some embodiments, the gate stack 304 is formed by various process steps such as layer deposition, patterning, etching, as well as other suitable processing steps. Exemplary layer deposition processes include CVD (including both low-pressure CVD and plasma-enhanced CVD), PVD, ALD, thermal oxidation, e-beam evaporation, or other suitable deposition techniques, or combinations thereof. In forming the gate stack for example, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods.

As indicated above, the gate stack 304 may include an additional gate dielectric layer. For example, the gate stack 304 may include silicon oxide. Alternatively or additionally, the gate dielectric layer of the gate stack 304 may include silicon nitride, a high-K dielectric material or other suitable material. In some embodiments, an electrode layer of the gate stack 304 may include polycrystalline silicon (polysilicon). Hard mask layers such as SiO2, Si3N4, silicon oxynitride, alternatively include silicon carbide, and/or other suitable compositions may also be included.

Figure 4B:
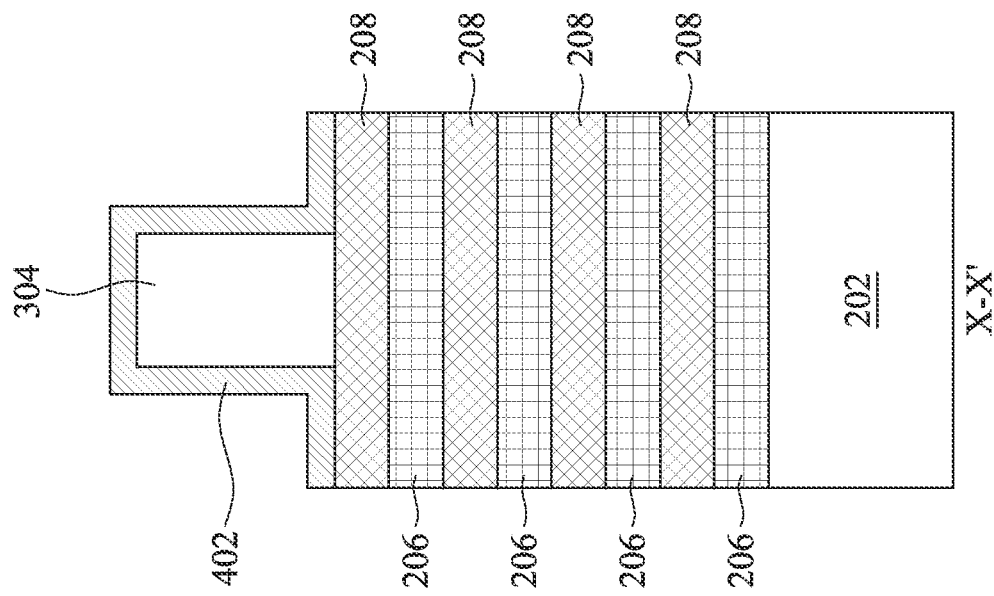
Figure 4A:
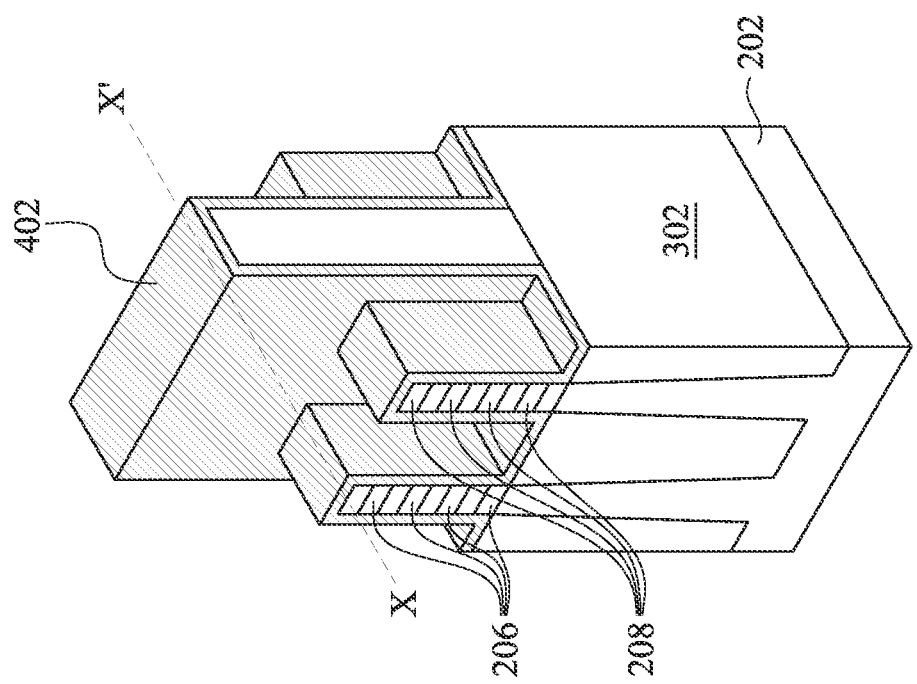
Figure 7B:
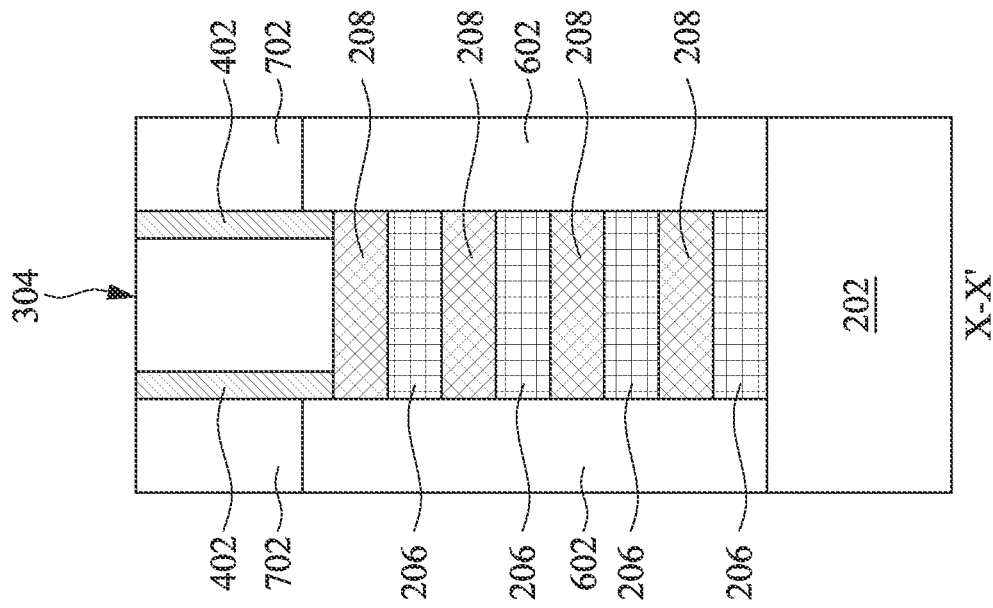
Figure 7A:
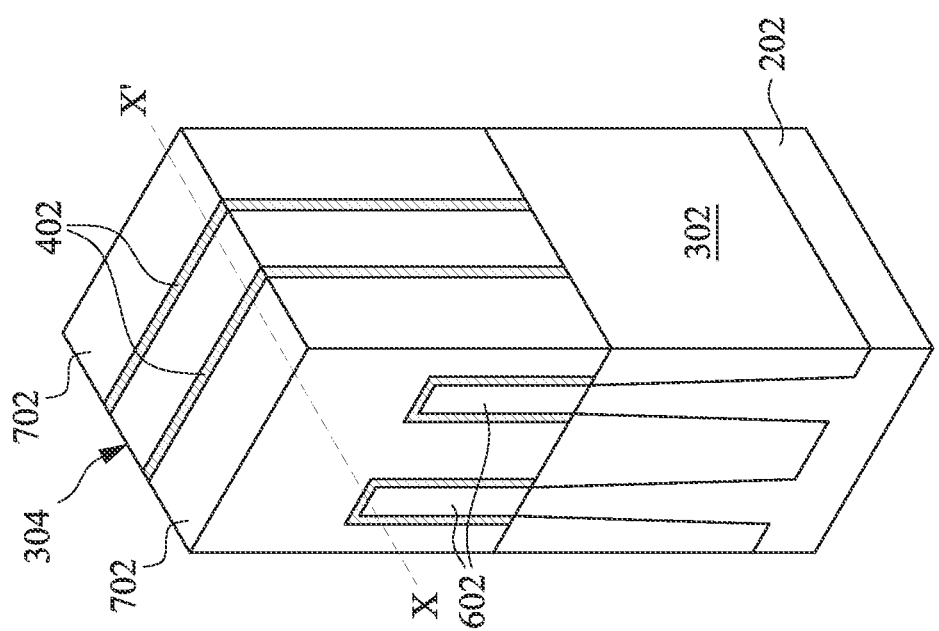

The method 100 then proceeds to block 110 where a spacer material layer is deposited on the substrate. Referring to the example of FIGS. 4A and 4B, a spacer material layer 402 is disposed on the substrate 202. The spacer layer 402 may include a dielectric material such as silicon oxide, silicon nitride, silicon carbide, silicon oxynitride, SiCN films, silicon oxycarbide, SiOCN films, and/or combinations thereof. In some embodiments, the spacer material layer 402 includes multiple layers, such as main spacer walls, liner layers, and the like. By way of example, the spacer material layer 402 may be formed by depositing a dielectric material over the gate stack 304 using processes such as, CVD process, a sub atmospheric CVD (SACVD) process, a flowable CVD process, an ALD process, a PVD process, or other suitable process. It is noted that the spacer conformal layer 402 is illustrated in FIG. 4B as covering the epitaxial stack 204.

In some embodiments, the deposition of the spacer material layer is followed by an etching back (e.g., anisotropically) the dielectric spacer material. Referring to the example, with reference to the example of FIGS. 5A, 5B, after formation of the spacer material layer 402, the spacer material layer 402 may be etched-back to expose portions of the fin elements 210 adjacent to and not covered by the gate structure 304 (e.g., source/drain regions). The spacer layer material may remain on the sidewalls of the gate structure 304 forming spacer elements. In some embodiments, etching-back of the spacer layer 402 may include a wet etch process, a dry etch process, a multiple-step etch process, and/or a combination thereof. The spacer layer 402 may be removed from a top surface of the exposed epitaxial stack 204 and the lateral surfaces of the exposed epitaxial stack 204, as illustrated in FIGS. 5A and 5B.

The method 100 then proceeds to block 112 where source/drain features are formed on the substrate. The source/drain features may be formed by performing an epitaxial growth process that provides an epitaxy material on the fin 210 in the source/drain region. In an embodiment, the epitaxy material of the source/drain is formed cladding the portions of the epitaxy layers remaining in the fins' source/drain regions. Referring to the example of FIGS. 6A and 6B, source/drain features 602 are formed on the substrate 202 in/on the fin 210 adjacent to and associated with the gate stack 304. Before the source/drain features 602 forming, epitaxial layer(s) 206 is etched back and inner spacers (not shown) are formed on the etched epitaxial layer(s) 206. The inner spacers separate epitaxial layer(s) 206 and the source/drain features 602. The source/drain features 602 include material formed by epitaxially growing a semiconductor material on the exposed epitaxial layer 208. It is noted that the shape of the features 602 is illustrative only and not intended to be limiting.

In various embodiments, the grown semiconductor material of the source/drain 602 may include Ge, Si, GaAs, AlGaAs, SiGe, GaAsP, SiP, or other suitable material. In some embodiments, the material of the source/drain 602 may be in-situ doped during the epi process. For example, in some embodiments, epitaxially grown material may be doped with boron. In some embodiments, epitaxially grown material may be doped with carbon to form Si:C source/drain features, phosphorous to form Si:P source/drain features, or both carbon and phosphorous to form SiCP source/drain features. In an embodiment, the epitaxial material of the source/drain 602 is silicon and the layer 208 also is silicon. In some embodiments, the layers 602 and 208 may comprise a similar material (e.g., Si), but be doped differently. In other embodiments, the epitaxy layer for the source/drain 602 includes a first semiconductor material, the epitaxially grown material 208 includes a second semiconductor different than the first semiconductor material. In some embodiments, the epitaxially grown material of the source/drain 602 is not in-situ doped, and, for example, instead an implantation process is performed.

The method 100 then proceeds to block 114 where an inter-layer dielectric (ILD) layer is formed on the substrate. Referring to the example of FIGS. 7A and 7B, in an embodiment of block 114, an ILD layer 702 is formed over the substrate 202. In some embodiments, a contact etch stop layer (CESL) is also formed over the substrate 202 prior to forming the ILD layer 702. In some examples, the CESL includes a silicon nitride layer, silicon oxide layer, a silicon oxynitride layer, and/or other materials known in the art. The CESL may be formed by plasma-enhanced chemical vapor deposition (PECVD) process and/or other suitable deposition or oxidation processes. In some embodiments, the ILD layer 702 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 702 may be deposited by a PECVD process or other suitable deposition technique. In some embodiments, after formation of the ILD layer 702, the semiconductor device 200 may be subject to a high thermal budget process to anneal the ILD layer.

In some examples, after depositing the ILD (and/or CESL or other dielectric layers), a planarization process may be performed to expose a top surface of the gate stack 304. For example, a planarization process includes a chemical mechanical planarization (CMP) process which removes portions of the ILD layer 702 (and CESL layer, if present) overlying the gate stack 304 and planarizes a top surface of the semiconductor device 200.

The method 100 then proceeds to block 116 where the dummy gate (see block 108) is removed. The gate electrode and/or gate dielectric may be removed by suitable etching processes. Referring to the example of FIGS. 8A and 8B, the gate stack 304 is removed leaving a trench 802.

Figure 9B:
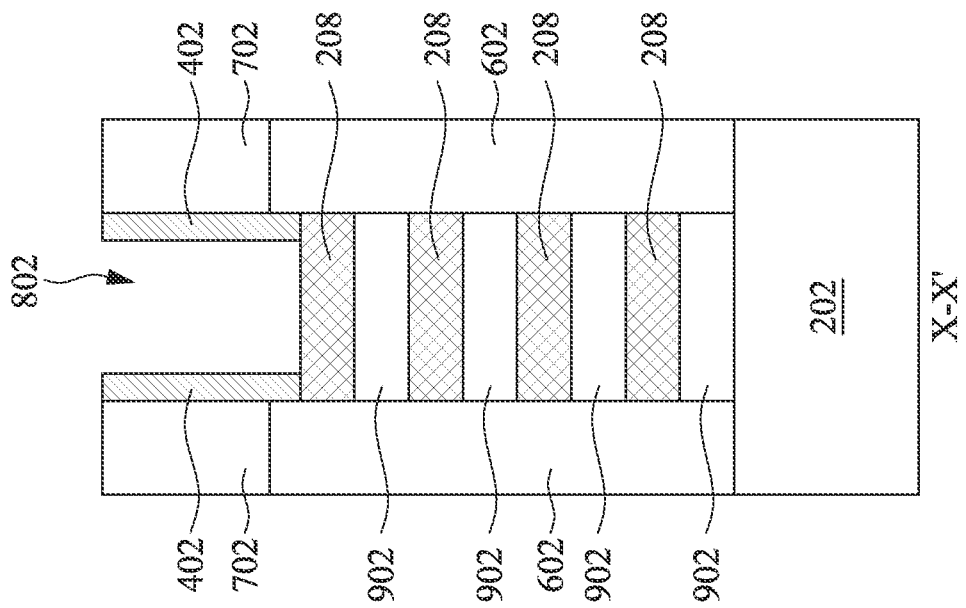
Figure 9A:
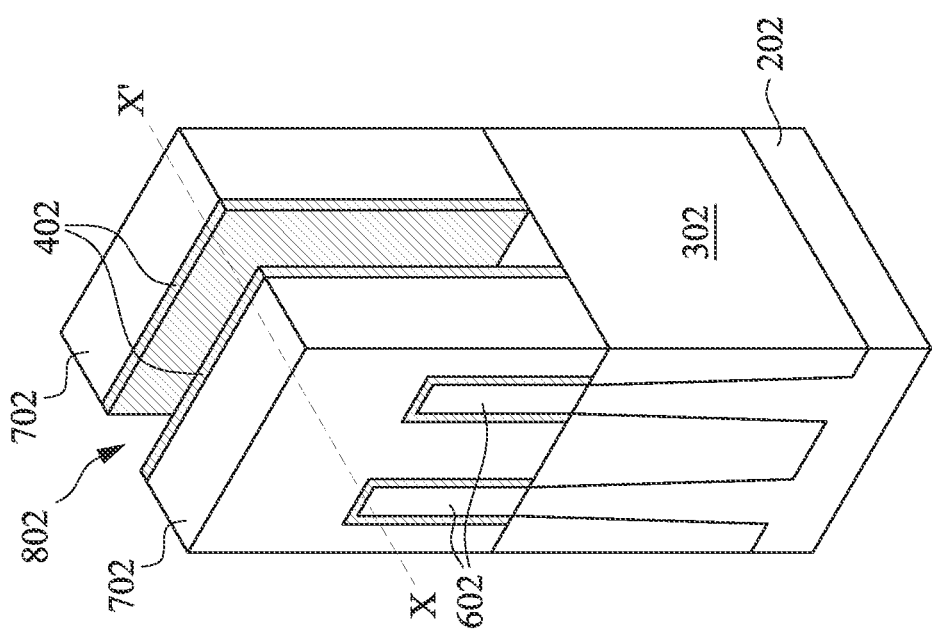

The method 100 then proceeds to block 118 where selective removal of epitaxial layer(s) 206 in the channel region of the device is provided. In embodiments, the selected epitaxial layer(s) 206 are removed in the fin elements within the trench 802 provided by the removal of the dummy gate electrode 304 (e.g., the region of the fin on and over which the gate structure will be formed, or the channel region). Referring to the example of FIGS. 9A and 9B, the epitaxy layers 206 are removed from the channel region of the substrate 202 and within the trench 802. In some embodiments, the epitaxial layers 206 are removed by a selective wet etching process. In some embodiments, the selective wet etching includes HF. In some embodiments, the selective wet etching includes an APM etch (e.g., ammonia hydroxide-hydrogen peroxide-water mixture). In some embodiments, the selective removal includes SiGe oxidation followed by a SiGeOx removal. For example, the oxidation may be provided by O3 clean and then SiGeOx remove by an etchant such as NH4OH. In an embodiment, the epitaxial layers 206 are SiGe and the epitaxial layers 208 are silicon allowing for the selective removal of the SiGe epitaxial layers 206. FIG. 9B illustrates gaps 902 in the place of the epitaxial layers 206. The gaps 902 may be filled with the ambient environment (e.g., air, N2).

The method 100 then proceeds to block 120 where a gate structure is formed. The gate structure may be the gate of a multi-gate transistor. The final gate structure may be a high-K/metal gate stack, however other compositions are possible. In some embodiments, the gate structure forms the gate associated with the multi-channels provided by the plurality of nanowires (now having gaps there between) in the channel region. Exemplary embodiments of the gate structure will be discussed in more detail.

Figure 10B:
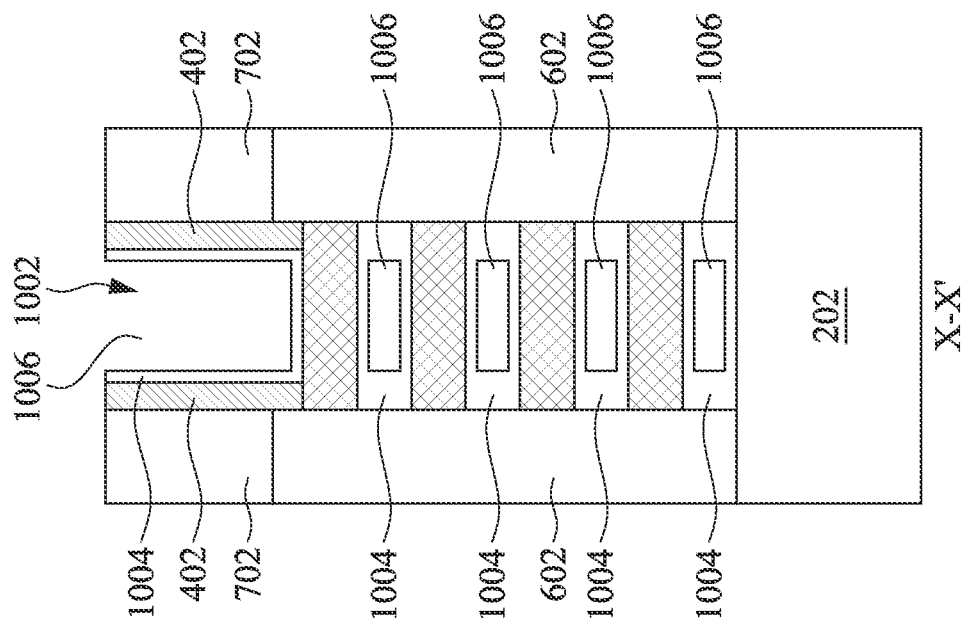
Figure 10A:
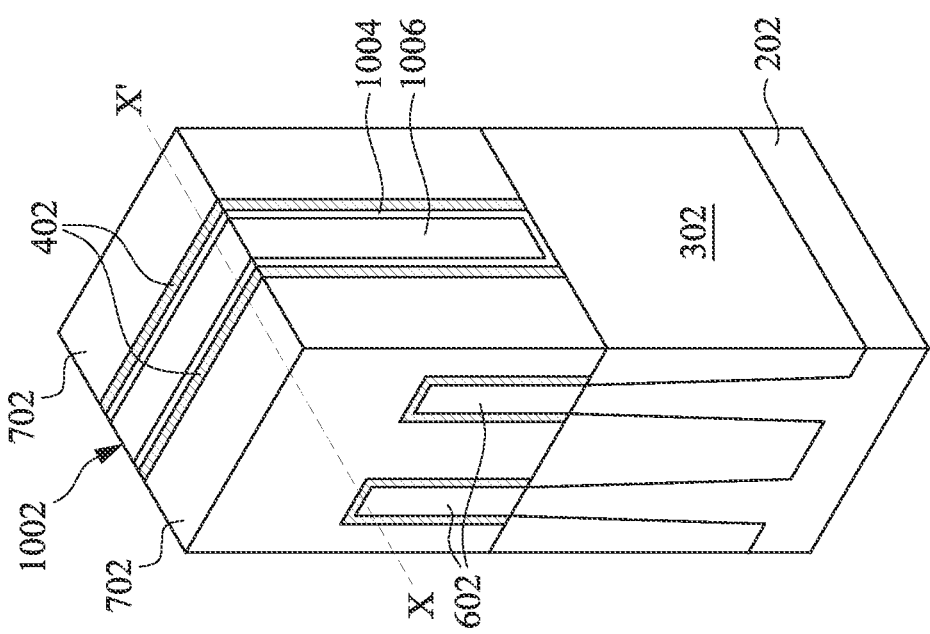

Referring to the example of FIGS. 10A and 10B, in an embodiment of block 120, a high-K/metal gate stack 1002 is formed within the trench of the device 200 provided by the removal of the dummy gate and/or release of nanowires, described above with reference to block 118. In various embodiments, the high-K/metal gate stack 1002 includes an interfacial layer, a high-K gate dielectric layer 1004 formed over the interfacial layer, and/or a metal layer 1006 formed over the high-K gate dielectric layer 1004. High-K gate dielectrics, as used and described herein, include dielectric materials having a high dielectric constant, for example, greater than that of thermal silicon oxide (~3.9). The metal layer used within high-K/metal gate stack may include a metal, metal alloy, or metal silicide. Additionally, the formation of the high-K/metal gate stack may include depositions to form various gate materials, one or more liner layers, and one or more CMP processes to remove excessive gate materials and thereby planarize a top surface of the semiconductor device 200.

In some embodiments, the interfacial layer of the gate stack 1002 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The gate dielectric layer 1004 of the gate stack 1002 may include a high-K dielectric layer such as hafnium oxide ($HfO_2$). Alternatively, the gate dielectric layer 1004 of the gate stack 1002 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$(BST), $Al_2O_3$, $Si_3N_4$, oxynitrides (SiON), combinations thereof, or other suitable material. The high-K gate dielectric layer 1004 may be formed by ALD, physical vapor deposition (PVD), CVD, oxidation, and/or other suitable methods. The metal layer of the high-K/metal gate stack 1002 may include a single layer or alternatively a multi-layer structure, such as various combinations of a metal layer with a selected work function to enhance the device performance (work function metal layer), a liner layer, a wetting layer, an adhesion layer, a metal alloy, or a metal silicide. By way of example, the metal layer of gate stack 1002 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In various embodiments, the metal layer of the gate stack 1002 may be formed by ALD, PVD, CVD, e-beam evaporation, or other suitable process. Further, the metal layer of the gate stack 1002 may be formed separately for N-FET and P-FET transistors which may use different metal layers. In various embodiments, a CMP process may be performed to remove excessive metal from the metal layer of the gate stack 1002, and thereby provide a substantially planar top surface of the metal layer of the gate stack 1002. The metal layer 1006 of the gate stack 1002 is illustrated in FIGS. 10A and 10B. In addition, the metal layer may provide an N-type or P-type work function, may serve as a transistor (e.g., FinFET) gate electrode, and in at least some embodiments, the metal layer of the gate stack 1002 may include a polysilicon layer. The gate structure 1002 includes portions that interpose each of the epitaxial layers 208, which each form channels of the multi-gate device 200.

In some embodiments, anti-reaction layers may be included in the gate stack 1002 to prevent oxidation. In some embodiments, the anti-reaction layers may comprise dielectric materials. In some embodiments, the anti-reaction layers may comprise silicon-based materials. In some embodiments, the anti-reaction layers may comprise silicon (Si), silicon oxide ($SiO_x$), silicon nitride (SiN), silicon oxynitride (SiON), silicon carbonitride (SiCN), silicon carbide (SiC), combinations or multiple layers thereof, or the like. However, any suitable material may be utilized. The anti-reaction layers may be deposited conformally by using a deposition process such as ALD, CVD, PVD, or the like. The anti-reaction layers may be deposited to thicknesses ranging from about 0.3 nm to about 5 nm.

In some embodiments, a glue layer may be included in the gate stack 1002. The glue layer may include any acceptable material to promote adhesion and prevent diffusion. For example, the glue layer may be formed of a metal or metal nitride such as titanium nitride, titanium aluminide, titanium aluminum nitride, silicon-doped titanium nitride, tantalum nitride, or the like, which may be deposited by ALD, CVD, PVD, or the like.

In an embodiment, the gate structure comprises a high-k dielectric layer, a p-type work function layer over the high-k dielectric layer, an n-type work function layer over the p-type work function layer, an anti-reaction layer over the n-type work function layer, and a glue layer over the anti-reaction layer. The gate structure may comprise different or additional layers or may omit layers discussed above. The layers of the gate structure may also be deposited in a different order. Additional layers may include barrier layers, diffusion layers, adhesion layers, combinations, or multiple layers thereof, or the like. In some embodiments, the additional layers may comprise materials including chlorine (Cl) or the like. The additional layers may be deposited by ALD, CVD, PVD, or the like.

The method 100 then proceeds to block 122 wherein further fabrication is performed. A semiconductor device may undergo further processing to form various features and regions known in the art. For example, subsequent processing may form contact openings, contact metal, as well as various contacts/vias/lines and multilayer interconnect features (e.g., metal layers and interlayer dielectrics) on the substrate, configured to connect the various features to form a functional circuit that may include one or more multi-gate devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 100, and some process steps described above may be replaced or eliminated in accordance with various embodiments of the method 100.

Figure 11:
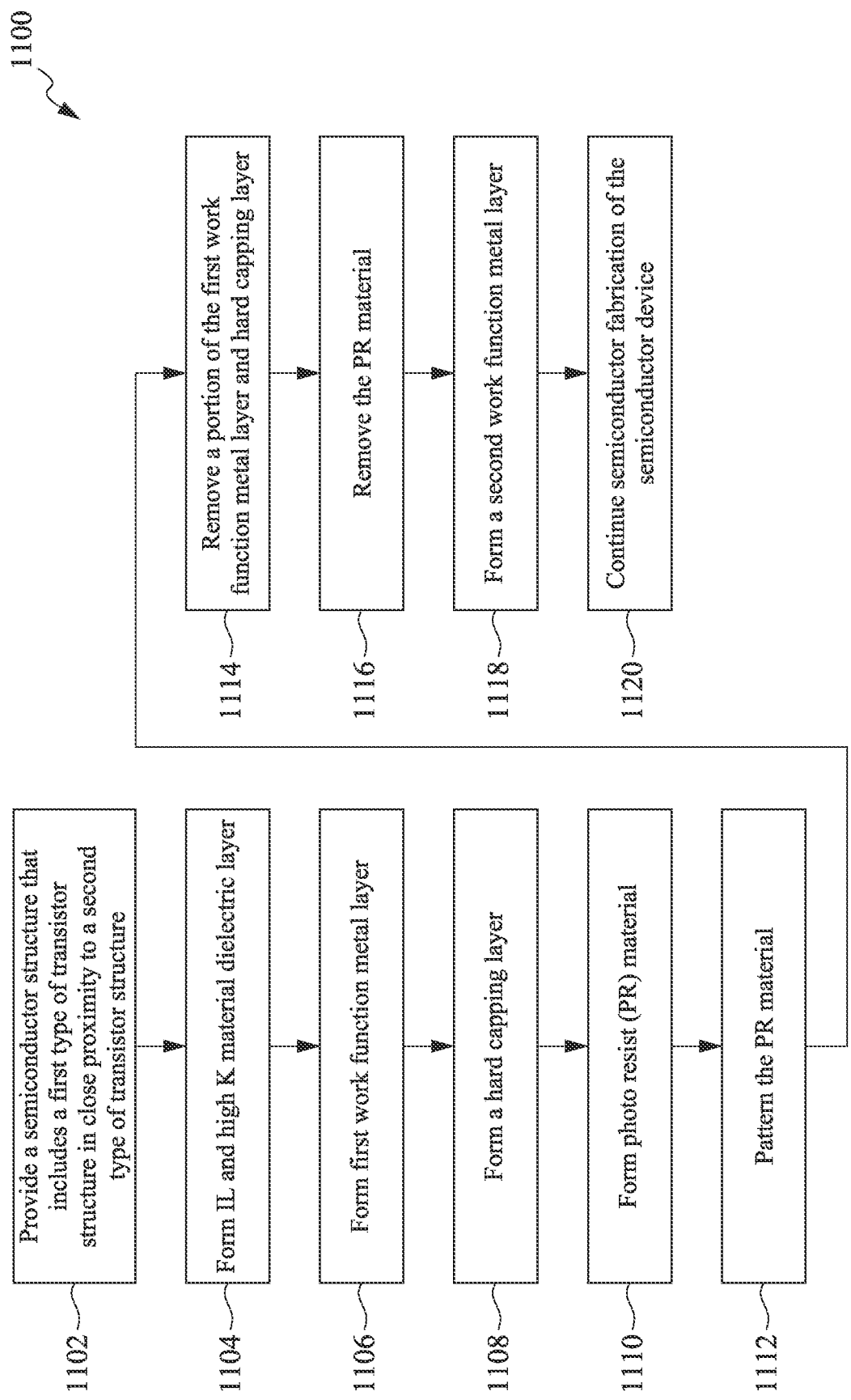
FIG. 11 is a flow chart depicting an example fabrication method for fabricating gate structures, in accordance with some embodiments.

FIG. 11 is a process flow chart depicting an example process 1100 for forming metal gate stacks in a semiconductor device having different types of adjacent transistors, according to various aspects of the present disclosure. FIG. 11 is described in conjunction with FIGS. 12A-12K, which are cross-sectional views of a semiconductor device, which illustrate the semiconductor device at various stages of fabrication in accordance with some embodiments of the present disclosure of the example process 1100. The process 1100 is merely an example, and is not intended to limit the present disclosure beyond what is explicitly recited in the claims. Additional steps may be provided before, during, and after example process 1100, and some of the steps described can be moved, replaced, or eliminated for additional embodiments of example process 1100. Additional features may be added in the semiconductor device depicted in the figures and some of the features described below can be replaced, modified, or eliminated in other embodiments of the semiconductor device.

It is understood that parts of the semiconductor device may be fabricated by typical semiconductor technology process flow, and thus some processes are only briefly described herein. Further, the exemplary semiconductor devices may include various other devices and features, such as other types of devices such as additional transistors, bipolar junction transistors, resistors, capacitors, inductors, diodes, fuses, and/or other logic devices, etc., but is simplified for a better understanding of concepts of the present disclosure. In some embodiments, the exemplary devices include a plurality of semiconductor devices (e.g., transistors), including PFETs, NFETs, etc., which may be interconnected. Moreover, it is noted that the operations of process 1100, including any descriptions given with reference to the Figures are merely exemplary and are not intended to be limiting beyond what is specifically recited in the claims that follow.

FIGS. 12A-12K schematically illustrates a portion of an example semiconductor device 1200 in a two-dimensional view along a cutline in a Y-axis plane at various stages of fabrication. In some figures, some reference numbers of components or features illustrated therein may be omitted to avoid obscuring other components or features; this is for ease of depicting the figures. Other aspects not illustrated in or described with respect to FIGS. 12A-12K may become apparent from the following figures and description. The semiconductor device 1200 may be part of an IC, such as a microprocessor, memory cell (such as static random-access memory (SRAM)), and/or other integrated circuits.

At block 1102, the example process 1100 includes providing a semiconductor structure that includes a first type of transistor structure in close proximity, e.g., immediately adjacent, to a second type of transistor structure. In various embodiments, the first type of transistor structure is an n-type structure, and the second type of transistor structure is an p-type structure.

At block 1104, the example process 1100 includes forming an interfacial layer (IL) over the transistor structures and a high-K material dielectric layer over the IL. Referring to the example of FIG. 12A, a semiconductor device 1200 includes n-type structures 1202 and p-type structures 1204 disposed over a semiconductor substrate. In some embodiments, the substrate may be a semiconductor substrate such as a silicon substrate. The substrate may include various layers, including conductive or insulating layers formed on a semiconductor substrate. The substrate may include various doping configurations depending on design requirements. For example, different doping profiles (e.g., n wells, p wells) may be formed on the substrate in regions designed for different device types (e.g., n-type field effect transistors (NFET), p-type field effect transistors (PFET)). The suitable doping may include ion implantation of dopants and/or diffusion processes. The substrate has isolation features (e.g., shallow trench isolation (STI) features 1203) interposing the regions providing different device types. The substrate may also include other semiconductors such as germanium, silicon carbide (SiC), silicon germanium (SiGe), or diamond. Alternatively, the substrate may include a compound semiconductor and/or an alloy semiconductor. Further, the substrate may be strained for performance enhancement, may include a silicon-on-insulator (SOI) structure, and/or have other suitable enhancement features.

The n-type structures 1202 include an epitaxial growth layer 1206 for N-type field effect transistors (FETs) (referred to herein as n-EPI layers) formation, and the p-type structure 1204 include an epitaxial growth layer 1208 for P-type FETs (referred to herein as p-EPI layers). The depicted example EPI layers 1206, 1208 are intermediate structures during fabrication of non-planar FETs such as gate-all-around (GAA) field-effect transistors (FETs).

An IL 1209 and a high-K material (HK) dielectric layer 1210 are deposited over the N-Type structure 1202 and the p-type structure 1204. In some embodiments, the IL 1209 may include a dielectric material such as silicon oxide ($SiO_2$), HfSiO, or silicon oxynitride (SiON). The IL 1209 may be formed by chemical oxidation, thermal oxidation, atomic layer deposition (ALD), chemical vapor deposition (CVD), and/or other suitable method. High-K gate dielectrics, as used and described herein, include dielectric materials having a high dielectric constant, for example, greater than that of thermal silicon oxide (~3.9). In various embodiments, the HK dielectric layer 1210 contains F, Cl, N, or O and contains Hf or Zr. In various embodiments, the HK dielectric layer 1210 contains Fluorine (F) or nitrogen (N) or N-type metal elements. In various embodiments, the HK dielectric layer 1210 has an atomic % range from $10^{-5}$% to 30%. In various embodiments, the HK dielectric layer 1210 includes a high-K dielectric layer such as hafnium oxide ($HfO_2$), $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The HK dielectric layer 1210 may be formed by ALD, physical vapor deposition (PVD), CVD, oxidation, and/or other suitable methods.

At block 1106, the example process 1100 includes forming a first work function metal layer. The first work function metal layer is formed over the high-K dielectric layer. In various embodiments the first work function metal layer includes an N-type work function metal containing titanium and aluminum, such as Titanium aluminide (TiAl). In various embodiments the first work function metal layer includes an N-type work function metal containing Ti, Al, Zn, Au, Ga, or Co. In various embodiments, the thickness of the first work function metal layer ranges from 0.5 to 20 nm.

Figure 12A:
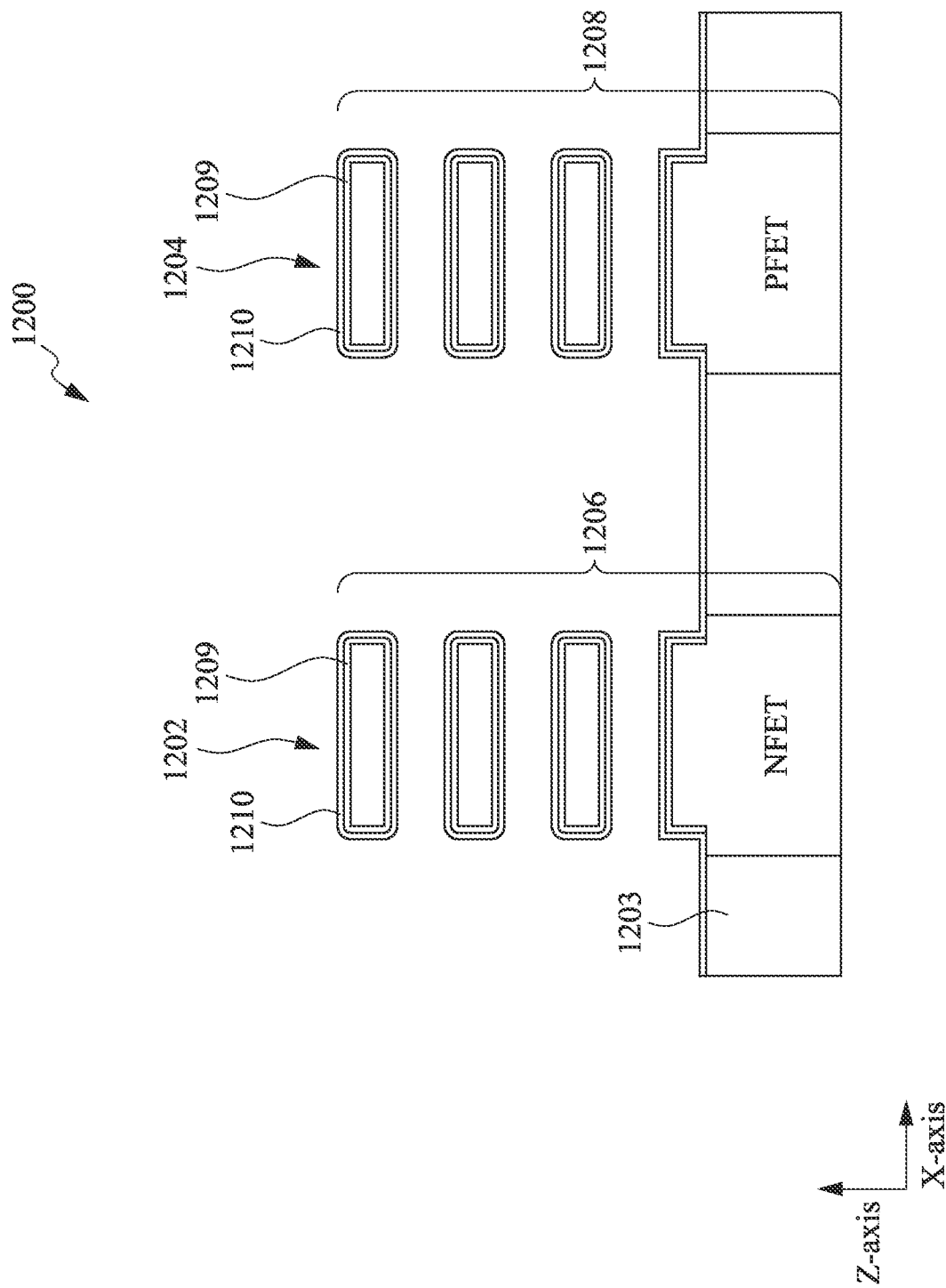
Figure 12B:
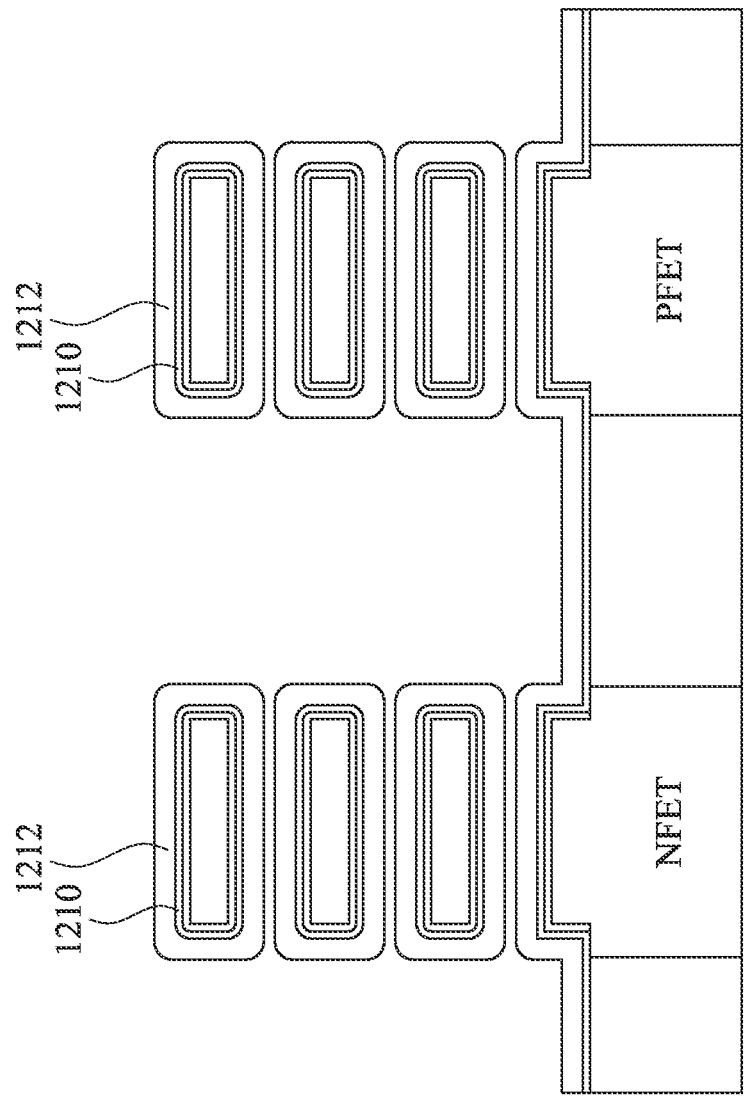

Referring to the example of FIG. 12B, in an embodiment of block 1106, a first work function metal layer 1212 is deposited over the HK dielectric layer 1210. The first work function metal layer comprises an n-type work function material, such as TiAl, that can provide a desired work function value for the gate electrode of an N-type transistor. The N-type work function material can be formed by any suitable process, such as atomic layer deposition (ALD), chemical vapor deposition (CVD), physical vapor deposition (PVD), remote plasma CVD (RPCVD), plasma enhanced CVD (PECVD), metal organic CVD (MOCVD), sputtering, plating, other suitable processes, and/or combinations thereof.

At block 1108, the example process 1100 includes forming a hard capping layer. The hard capping layer includes a hard metal layer plus an underlying barrier metal layer. The barrier metal layer is formed over the first work function metal layer and the hard metal layer is formed over the barrier metal layer. In various embodiments, the hard metal layer 1216 comprises a metal that is hard and has high-oxidization resistance, such as W, Nb, Mo, and their nitride compounds. In various embodiments, the hard metal layer comprises a tungsten (W) based material such as tungsten carbonitride (WCN). In various embodiments, the hard metal layer 1216 has a thickness ranging from 0.5 to 20 nm. In various embodiments, the barrier metal layer comprises a nitride based barrier, such as titanium nitride (TiN), niobium nitride (NbN), molybdenum nitride (MoN), and others.

Figure 12C:
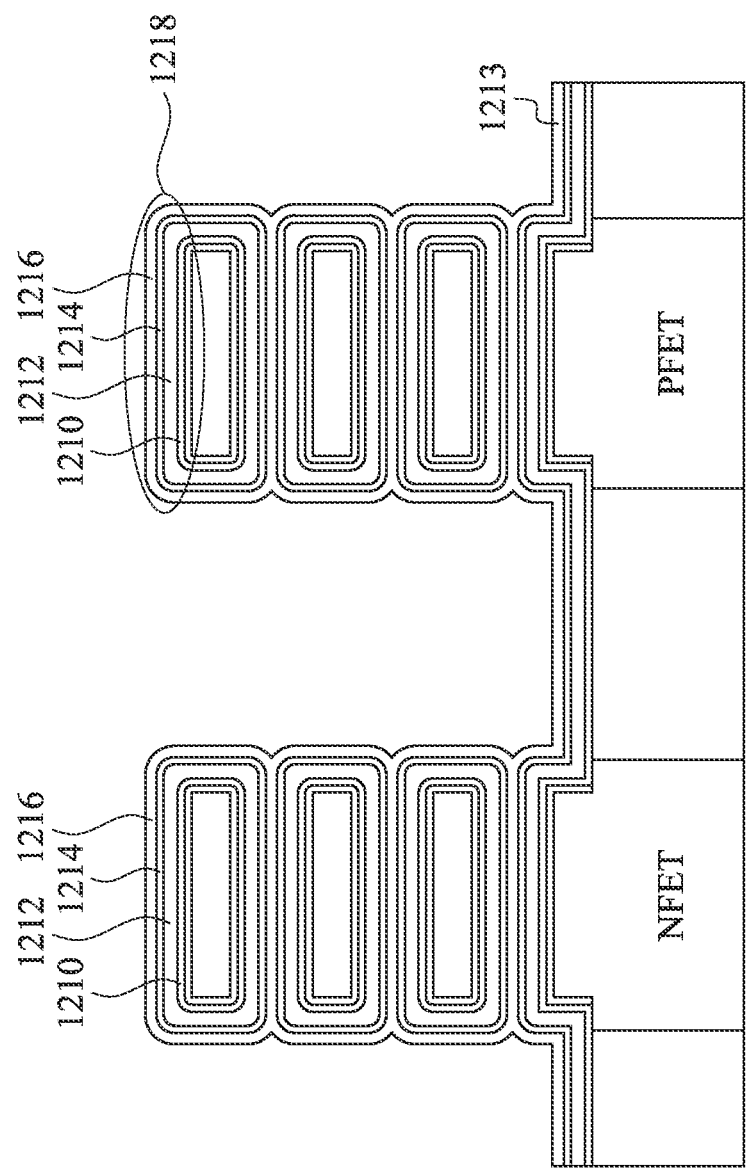

Referring to the example of FIG. 12C, in an embodiment of block 1108, a hard capping layer 1213 has been deposited over the first work function metal layer 1212. The hard capping layer 1213 includes a barrier metal layer 1214 deposited over the first work function metal layer 1212 and a hard metal layer 1216 deposited over the barrier metal layer 1214. In various embodiments, the hard metal layer 1216 has a thickness ranging from 0.5 to 20 nm. The hard capping layer 1213 may be deposited by ALD, CVD, suitable processes, and/or combinations thereof. In various embodiments, deposition of the hard metal layer 1216 involves the use of precursors containing fluorine such as $WF_6$, $NbF_3$, $NbF_4$, $NbF_5$, $MoF_6$. The use of precursors containing fluorine can block Al.

Figure 12D:
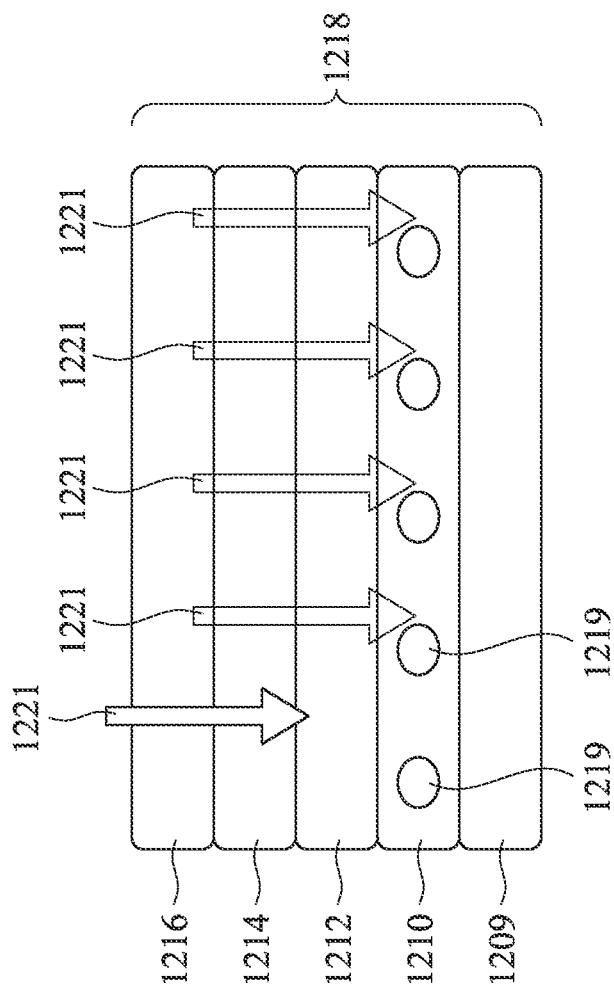
Figure 12E:
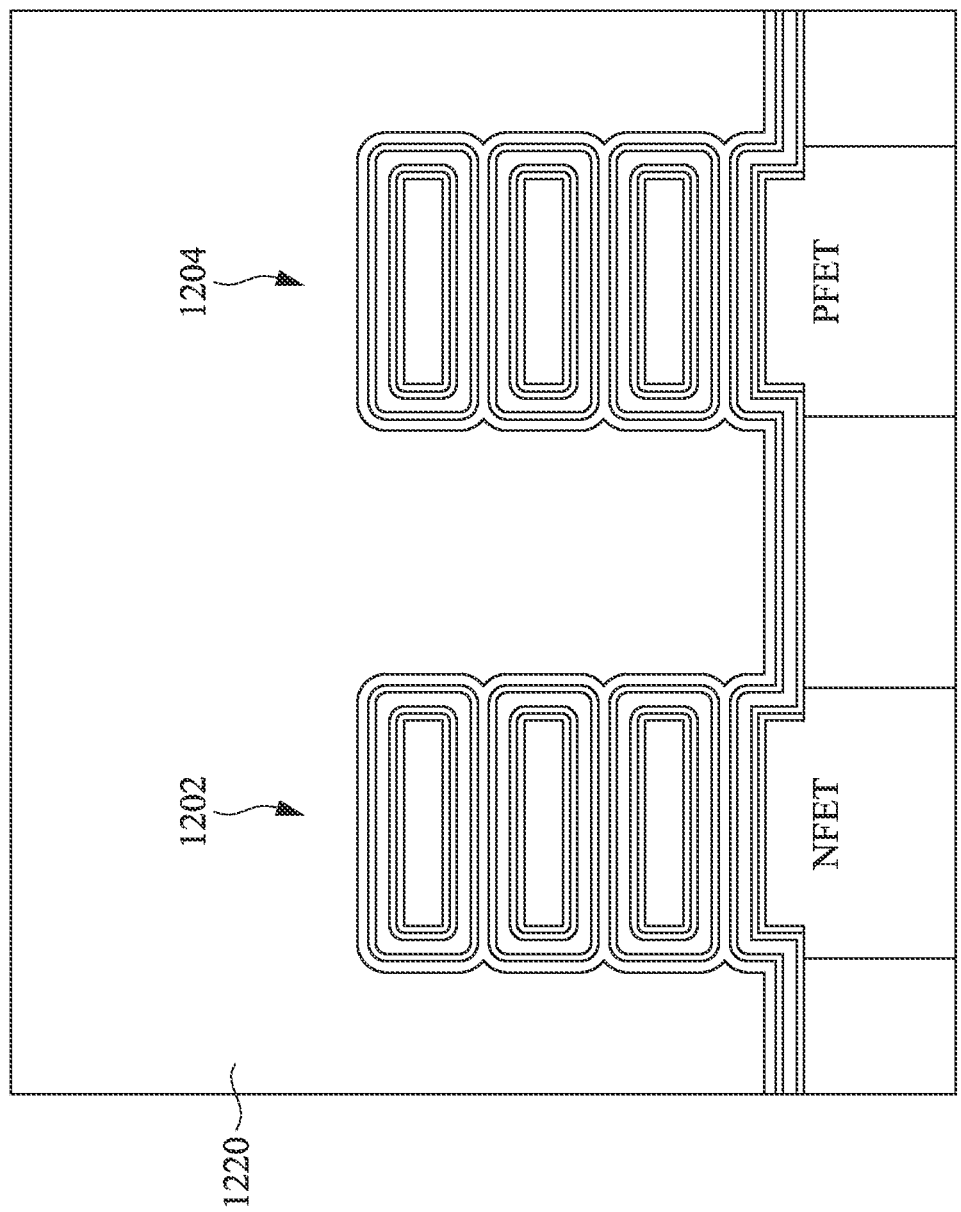
Figure 12F:
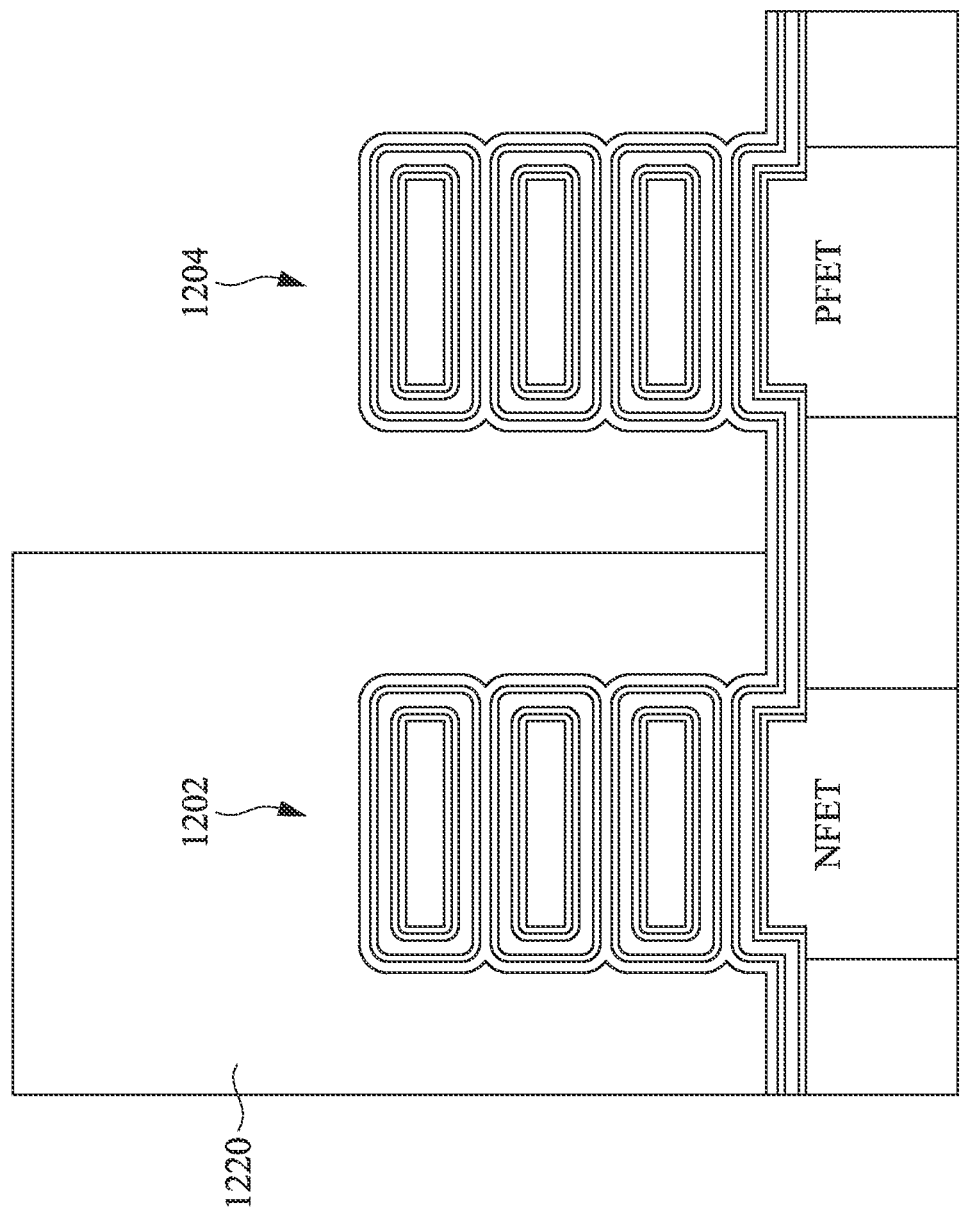

The example of FIG. 12D, which is an expanded view of a portion of area 1218 from FIG. 12C, illustrates a potential benefit of the use of precursors containing fluorine such as $WF_6$, $NbF_3$, $NbF_4$, $NbF_5$, $MoF_6$ at block 1108. During fabrication operations, defects 1219 may form in the HK material dielectric layer 1210. At block 1108, fluorine 1221 from the deposition precursors diffuses through the hard metal layer 1216, barrier metal layer 1214, and first work function metal layer 1212 to passivate defects 1219 in the HK dielectric layer 1210 thereby repairing the HK material dielectric layer 1210 and accomplishing threshold voltage tuning.

At block 1110, the example process 1100 includes forming photoresist (PR) material over the n-type structure and the p-type structure. Referring to the example of FIG. 12E, in an embodiment of block 1110, PR material 1220 is deposited over the n-type structure 1202 and the p-type structure 1204.

At block 1112, the example process 1100 includes patterning the PR material. The PR material is patterned to expose an opening over the second transistor structure of the second transistor type such as a p-type structure. Referring to the example of FIG. 12F, in an embodiment of block 1112, the PR material 1220 is patterned to expose an opening over the p-type structure 1204 to allow processing over regions of the p-type structure 1204 while leaving the remaining regions intact.

At block 1114, the example process 1100 includes removing a portion of the first work function metal layer, barrier metal layer, and hard metal layer. The portion of the first work function metal layer, barrier metal layer, and hard metal layer that is removed includes first work function metal layer, barrier metal layer, and hard metal layer over the second transistor structure of the second transistor type such as a p-type structure but not from over the first transistor structure of the first transistor type such as an n-type structure.

The portion of the first work function metal layer, barrier metal layer, and hard metal layer may be removed from the p-type structure via wet etching operations. For example, the etching process may be performed by dipping, immersing, or soaking the substrate with or in an etching solution in a wet tank.

The wet etching operations are performed using high selectivity chemicals. The high selectivity chemicals are chosen to have high selectivity to the first work function metal layer, barrier metal layer, and hard metal layer capping, to have high selectivity against the PR material, and to suppress wet etching penetration into the area protected by the PR material. Etch rates of the first work function metal layer, barrier metal layer, and hard metal layer capping using the high selectivity chemicals are greater than an etch rate of the PR material based on exposure to the high selectivity chemicals. Because etch rates of the first work function metal layer, barrier metal layer, and hard metal layer capping using the high selectivity chemicals are greater than an etch rate of the PR material, wet etching penetration into the area protected by the PR material is suppressed. The high selectivity chemicals include an alkaline, such as $NH_4OH$, TMAH-like, and/or amine, at a concentration range from 0.1 to 50 wt %; oxidants, such as $H_2O_2$ and/or ozone, at a concentration range from 0.1 to $10^7$ ppm; and acid, such as HF, HCl, HBr, or Organic acid, at a concentration range from 0.1 to 50 wt %. The alkaline and oxidant are used to remove the hard capping layer (barrier metal layer and hard metal layer) from the region over the second transistor structure of the second transistor type (e.g., P-type) and the acid is used to remove the first work function metal layer (e.g., n-metal layer comprising TiAl) over the second transistor structure of the second transistor type (e.g., P-type).

Figure 12G:
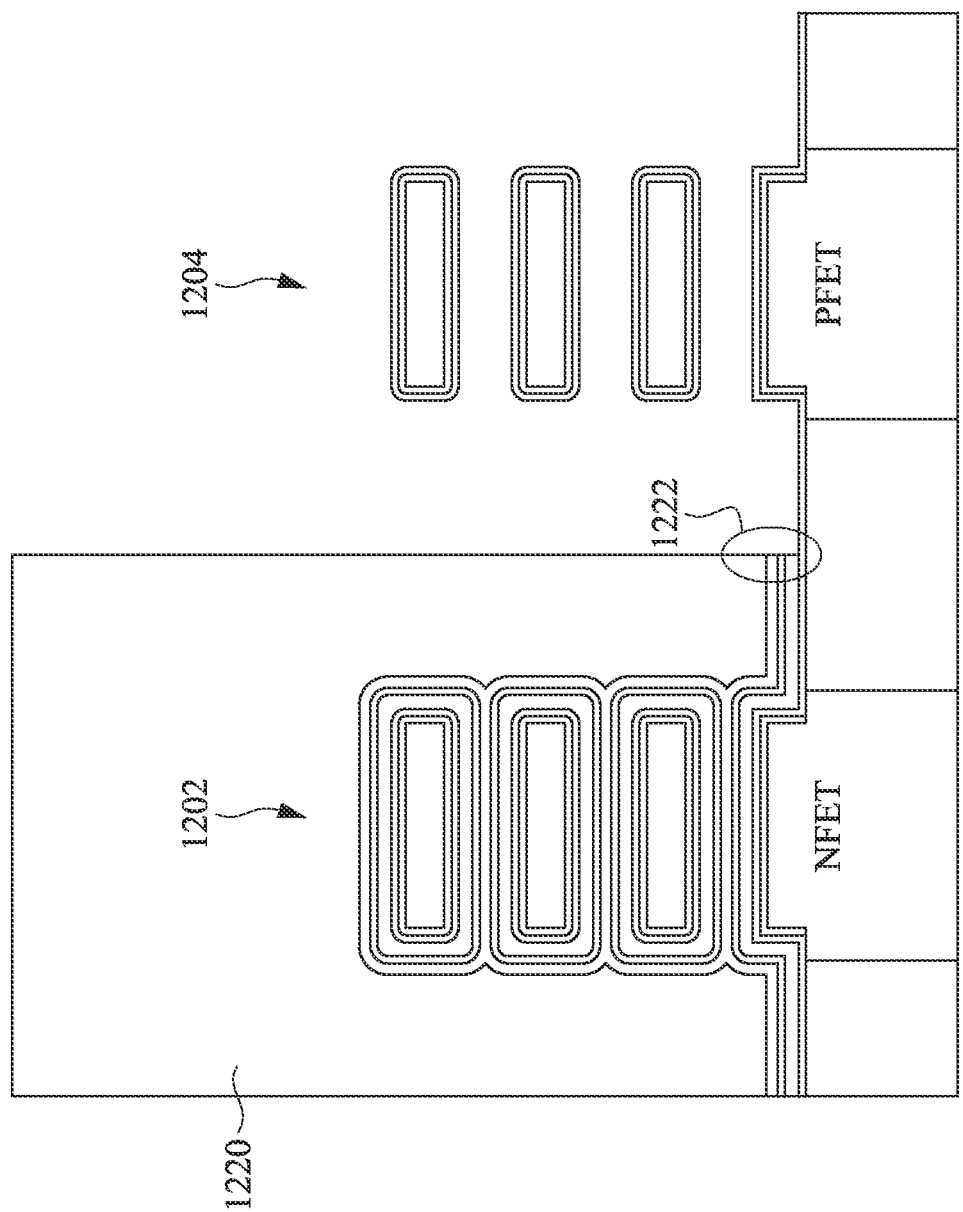
Figure 12H:
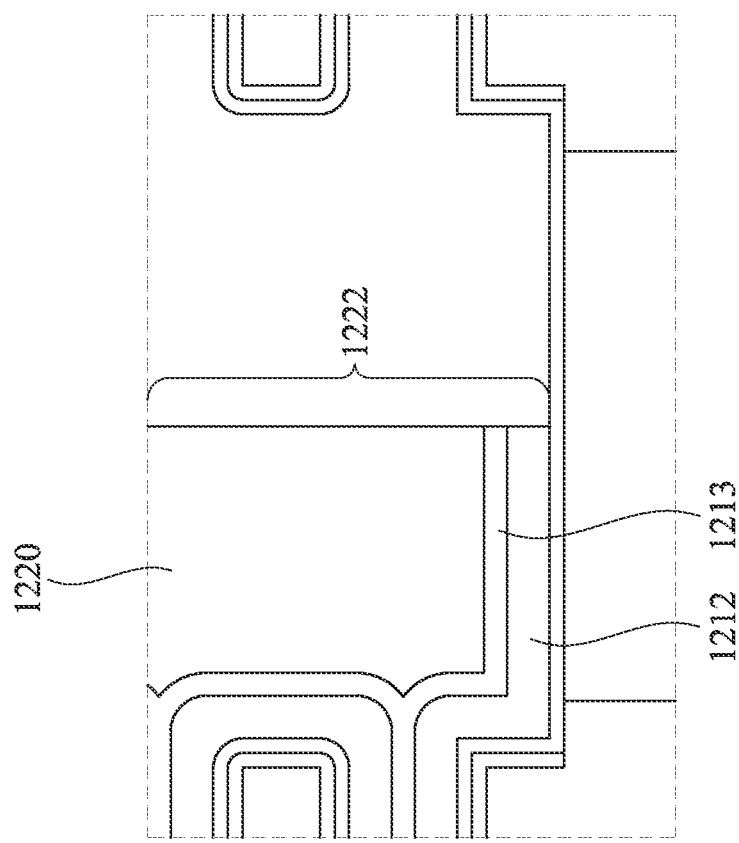

Referring to the example of FIG. 12G, in an embodiment of block 1114, the portion of the first work function metal layer 1212, barrier metal layer 1214, and hard metal layer 1216 that is removed includes first work function metal layer 1212, barrier metal layer 1214, and hard metal layer 1216 over the second transistor structure of the second transistor type such as a p-type structure 1204 but not from over the first transistor structure of the first transistor type such as an n-type structure 1202. As illustrated in FIG. 12H, which is an expanded view of section 1222 of FIG. 12G, because the high selectivity chemicals have high selectivity against the PR 1220, wet etching penetration has been suppressed in the area protected by the PR (undesired wet etching, including lateral etching, of the first work function metal layer 1212 and the hard capping layer 1213 in the region of the transistor structure of the first transistor type has been suppressed).

At block 1116, the example process 1100 includes removing the PR material. The PR material may be removed, for example, by an ashing process. For example, an ashing process using oxygen plasma may be used to remove the PR material. The hard metal layer 1216, functions to insulate the gate structure from aluminum oxidation when removing the patterned PR material. Without the hard metal layer 1216, aluminum from the first work function metal layer 1212 may be oxidized by oxygen (126) from the oxygen plasma used in the ashing process to remove the PR material 1220. The hard metal layer 1216 forms a barrier that resists aluminum oxidation.

Figure 12I:
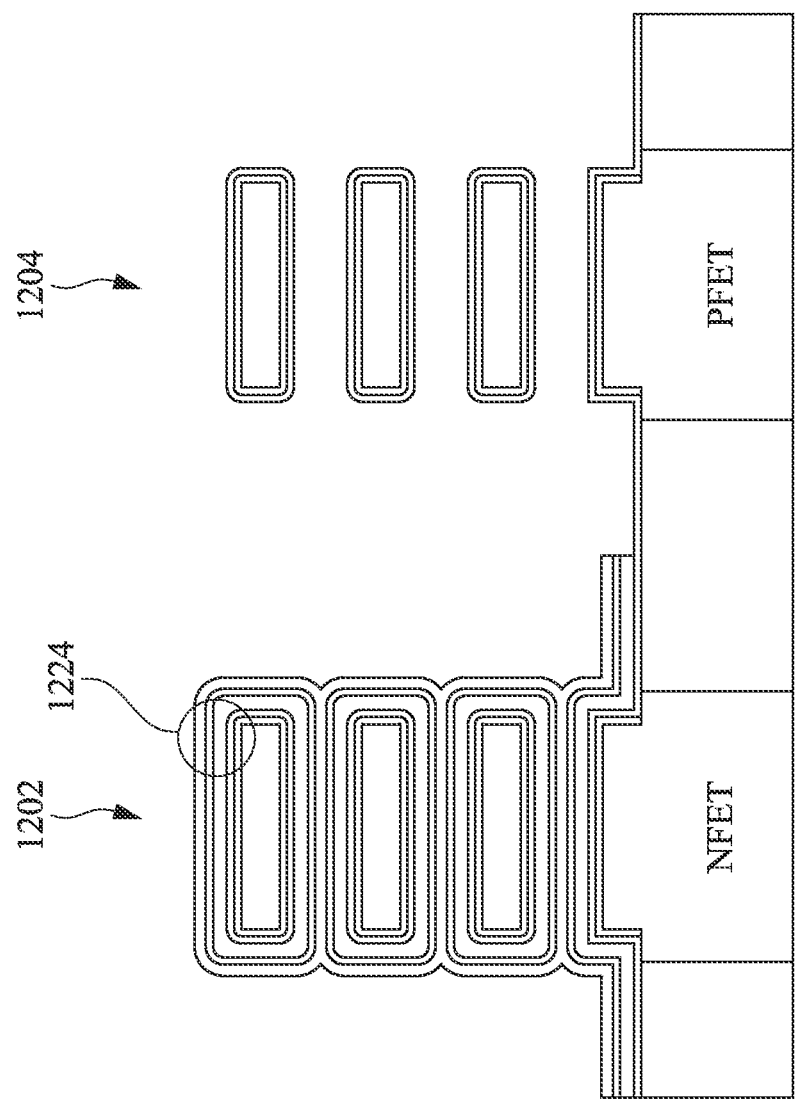
Figure 12J:
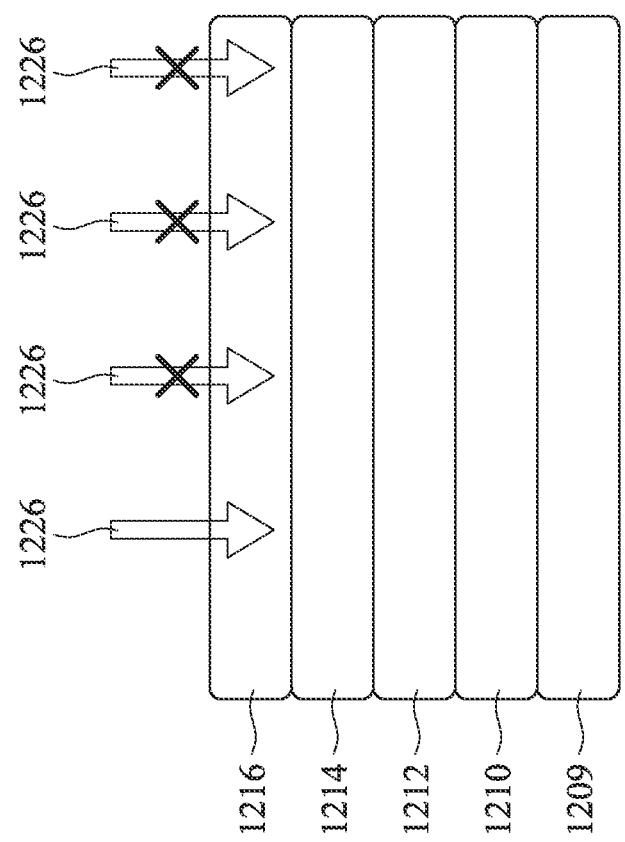

Referring to the example of FIG. 12I, in an embodiment of block 1116, the PR material 1220 has been removed from around the first transistor structure of the first transistor type (e.g., n-type structure 1202) without aluminum oxidation. FIG. 12J, which is an expanded view of section 1224 of FIG. 12I, illustrates that the hard metal layer 1216 can suppress oxidation of underlying layers during a PR ashing process thereby protecting the first work function metal layer 1212. As illustrated, $O_2$ (1226) is suppressed from oxidizing aluminum in the first work function metal layer 1212.

At block 1118, the example process 1100 includes forming a second work function metal layer. The second work function metal layer is formed over the first transistor structure of the first transistor type (e.g., n-type structure) and the second transistor structure of the second transistor type (e.g., p-type structure). In various embodiments the second work function metal is a P-type work function metal containing Titanium, such as TiN.

Referring to the example of FIG. 12K, in an embodiment of block 1118, a second work function metal layer 1228 is deposited over the first transistor structure of the first transistor type (e.g., n-type structure 1202) and the second transistor structure of the second transistor type (e.g., p-type structure 1204). The second work function metal layer may 1228 include a transition metal, such as TiN or any suitable materials or a combination thereof. The second work function metal layer 1228 may be deposited by ALD, CVD, PVD, remote plasma CVD (RPCVD), plasma enhanced CVD (PECVD), metal organic CVD (MOCVD), sputtering, plating, other suitable processes, and/or combinations thereof. The material of the second work function metal layer 1228 is chosen to tune a work function value so that a desired threshold voltage (Vt) is achieved in the device that is to be formed in the respective region. In this example, the second work function metal layer 1228 comprises a p-type work function material that can provide a desired work function value for the gate electrode of a P-type transistor.

In addition to the IL 1209, HK dielectric layer 1210, first work function metal layer 1212, hard capping layer 1213, and second work function metal layer 1228, the gate structure may comprise different or additional layers. Additional layers may include diffusion layers, adhesion layers, combinations, or multiple layers thereof, or the like. The additional layers may be deposited by ALD, CVD, PVD, or the like.

At block 1120, the example process 1100 includes continuing semiconductor fabrication of the semiconductor device. Also, additional fabrication operations not described in process 1100 can occur before, between, and after the blocks 1102-1118 included in process 1100.

A semiconductor device may undergo further processing to form various features and regions. For example, subsequent processing may form contact openings, contact metal, as well as various contacts/vias/lines and multilayer interconnect features (e.g., metal layers and interlayer dielectrics) on the substrate, configured to connect the various features to form a functional circuit that may include one or more multi-gate devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure.

Improved systems, fabrication methods, fabrication techniques, and articles have been described. The described systems, methods, techniques, and articles can be used with a wide range of semiconductor devices including GAA and FinFET devices.

In various embodiments, a semiconductor device including a first type of transistor and a second type of transistor adjacent to the first type of transistor is disclosed. The semiconductor device includes a first gate structure for the first type of transistor. The first gate structure includes: a high-k dielectric layer; a first work function metal layer disposed over the high-k dielectric layer; a hard capping layer disposed over the first work function metal layer, wherein the hard capping layer includes a hard metal layer and a barrier metal layer; and a second work function metal layer disposed over the hard capping layer. The semiconductor device further includes a second gate structure for the second type of transistor. The second gate structure includes the high-k dielectric layer; and the second work function metal layer disposed over the high-k dielectric layer without the first work function metal layer and the hard capping layer disposed between the high-k dielectric layer and the second work function metal layer. The second work function metal layer is configured to provide a desired work function value for the second gate structure.

In certain embodiments of the semiconductor device, the hard metal layer of the hard capping layer includes tungsten (W), Niobium (Nb), or molybdenum (Mo).

In certain embodiments of the semiconductor device, the barrier metal layer of the hard capping layer includes a nitride.

In certain embodiments of the semiconductor device, the barrier metal layer of the hard capping layer includes titanium nitride (TiN), niobium nitride (NbN), or molybdenum nitride (MoN).

In certain embodiments of the semiconductor device, the first type of transistor includes an N-type transistor, the second type of transistor includes a P-type transistor, the first work function metal layer includes an N-type work function metal, and the second work function metal layer includes a P-type work function metal.

In certain embodiments of the semiconductor device, the first work function metal layer includes Titanium (Ti) and Aluminum (Al).

In certain embodiments of the semiconductor device, the second work function metal layer includes Titanium (Ti).

In certain embodiments of the semiconductor device, the high-K dielectric layer includes: F, Cl, N, or O; and Hf or Zr.

A method of forming gate structures for a first type of transistor and a second type of transistor that are formed adjacent to each other is disclosed. The method includes: forming an interfacial layer (IL) and a high-K material (HK) dielectric layer over a region for forming the first type of transistor and the second type of transistor; forming a first work function metal layer over the HK dielectric layer; forming a hard capping layer over the first work function metal layer, wherein the hard capping layer includes a hard metal layer; patterning photo resist (PR) material over the hard capping layer that exposes a portion of the hard capping layer over the region for forming the second type of transistor; removing the first work function metal layer and the hard capping layer over the exposed region for forming the second type of transistor, wherein the removing includes removing the hard capping layer via wet etching operations using high selectivity chemicals that are highly selective to the hard capping layer and the first work function metal layer; removing the patterned PR material; and forming a second work function metal layer over the hard capping layer that remains over the first type of transistor and over the region for forming the second type of transistor.

In various embodiments, the method further includes diffusing fluorine from deposition precursors during operations for forming the hard capping layer, the diffusing including diffusing through the hard capping layer and the first work function metal layer thereby repairing defects in the HK dielectric layer.

In various embodiments, the method further includes insulating, by the hard capping layer, a gate structure from aluminum oxidation when removing the patterned PR material.

In various embodiments of the method, the high selectivity chemicals include an alkaline and oxidant for removing the hard capping layer and an acid for removing the first work function metal layer.

In various embodiments of the method, the hard metal layer of the hard capping layer includes tungsten (W), Niobium (Nb), or molybdenum (Mo).

In various embodiments of the method, the hard capping layer further includes a barrier metal layer, and the barrier metal layer includes titanium nitride (TiN), niobium nitride (NbN), or molybdenum nitride (MoN).

In various embodiments of the method, the first type of transistor includes an N-type transistor, the second type of transistor includes a P-type transistor, the first work function metal layer includes an N-type work function metal, and the second work function metal layer includes a P-type work function metal.

A method of forming gate structures for n-type transistors and p-type transistors that are adjacent to each other is disclosed. The method includes: forming an interfacial layer (IL) and a high-K material (HK) dielectric layer over a region for forming the n-type transistor and the p-type transistor; forming an n-type metal layer over the HK dielectric layer; forming a hard capping layer over the n-type metal layer, wherein the hard capping layer includes a hard metal layer; patterning photo resist (PR) material over the hard capping layer that exposes a portion of the hard capping layer over the region for forming the p-type transistor; removing the n-type metal layer and the hard capping layer over the exposed region for forming the p-type transistor, wherein the removing includes removing the hard capping layer via wet etching operations using high selectivity chemicals that are highly selective to the hard capping layer and the n-type metal layer; removing the patterned PR material while insulating, by the hard capping layer, a gate structure for the n-type transistor from aluminum oxidation; and forming a p-type metal layer over the hard capping layer that remains over the n-type transistor and over the region for forming the p-type transistor.

In certain embodiments, the method further includes diffusing fluorine from deposition precursors during operations for forming the hard capping layer, wherein the diffusing includes diffusing through the hard capping layer and the n-type metal layer thereby repairing defects in the HK dielectric layer.

In certain embodiments of the method, the high selectivity chemicals include an alkaline and oxidant for removing the hard capping layer and an acid for removing the n-type metal layer.

In certain embodiments of the method, the hard metal layer of the hard capping layer includes tungsten (W), Niobium (Nb), or molybdenum (Mo).

In certain embodiments of the method, the hard capping layer further includes a barrier metal layer, and the barrier metal layer includes a nitride.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A method of forming gate structures for a first type of transistor and a second type of transistor that are formed adjacent to each other,
the method comprising:
   forming an interfacial layer (IL) and a high-K material (HK) dielectric layer over a region for forming the first type of transistor and the second type of transistor;

forming a first work function metal layer over the HK dielectric layer; forming a hard capping layer over the first work function metal layer, the hard capping layer comprising a hard metal layer;

patterning photo resist (PR) material over the hard capping layer that exposes a portion of the hard capping layer over the region for forming the second type of transistor;

removing the first work function metal layer and the hard capping layer over the exposed region for forming the second type of transistor, the removing comprising removing the hard capping layer via wet etching operations using high selectivity chemicals that are highly selective to the hard capping layer and the first work function metal layer, wherein etch rates of the first working function metal layer and the hard capping layer using the high selectivity chemicals are greater than an etch rate of the PR material;

removing the patterned PR material; and forming a second work function metal layer over the hard capping layer that remains over the first type of transistor and over the region for forming the second type of transistor.

2. The method of claim 1, further comprising diffusing fluorine from deposition precursors during operations for forming the hard capping layer, the diffusing including diffusing through the hard capping layer and the first work function metal layer thereby repairing defects in the HK dielectric layer.

3. The method of claim 1, further comprising insulating, by the hard capping layer, a gate structure from aluminum oxidation when removing the patterned PR material.

4. The method of claim 1, wherein the high selectivity chemicals comprise an alkaline and oxidant for removing the hard capping layer and an acid for removing the first work function metal layer.

5. The method of claim 1, wherein the hard metal layer of the hard capping layer comprises tungsten (W), Niobium (Nb), or molybdenum (Mo).

6. The method of claim 1, wherein the hard capping layer further comprises a barrier metal layer and the barrier metal layer comprises titanium nitride (TiN), niobium nitride (NbN), or molybdenum nitride (MoN).

7. The method of claim 1, wherein:
the first type of transistor comprises an N-type transistor and the second type of transistor comprises a P-type transistor; and
the first work function metal layer comprises an N-type work function metal and the second work function metal layer comprises a P-type work function metal.

8. A method of forming gate structures for n-type transistors and p-type transistors that are adjacent to each other, the method comprising:
forming an interfacial layer (IL) and a high-K material (HK) dielectric layer over a region for forming the n-type transistor and a region for forming the p-type transistor;
forming an n-type metal layer over the HK dielectric layer;
forming a hard capping layer over the n-type metal layer, the hard capping layer comprising a hard metal layer;
patterning photo resist (PR) material over the hard capping layer that exposes a portion of the hard capping layer over the region for forming the p-type transistor;
removing the n-type metal layer and the hard capping layer over the exposed region for forming the p-type transistor, the removing comprising removing the hard capping layer via wet etching operations using high selectivity chemicals that are highly selective to the hard capping layer and the n-type metal layer;
removing the patterned PR material while insulating, by the hard capping layer, a gate structure for the n-type transistor from aluminum oxidation; and
forming a p-type metal layer over the hard capping layer that remains over the n-type transistor and over the region for forming the p-type transistor.

9. The method of claim 8, further comprising diffusing fluorine from deposition precursors during operations for forming the hard capping layer, the diffusing including diffusing through the hard capping layer and the n-type metal layer thereby repairing defects in the HK dielectric layer.

10. The method of claim 8, wherein the high selectivity chemicals comprise an alkaline and oxidant for removing the hard capping layer and an acid for removing the n-type metal layer.

11. The method of claim 8, wherein the hard metal layer of the hard capping layer comprises tungsten (W), Niobium (Nb), or molybdenum (Mo).

12. The method of claim 8, wherein the hard capping layer further comprises a barrier metal layer and the barrier metal layer comprises a nitride.

13. A method of forming gate structures for a first type of transistor and a second type of transistor that are formed adjacent to each other, the method comprising:
forming an interfacial layer (IL) and a high-K material (HK) dielectric layer over a transistor region for the first type of transistor and a transistor region for the second type of transistor;
forming a first work function metal layer over the HK dielectric layer;
forming a hard capping layer over the first work function metal layer, the hard capping layer comprising a hard metal layer and a barrier metal layer;
removing the first work function metal layer and the hard capping layer over the transistor region for the second type of transistor; and
forming a second work function metal layer over the hard capping layer that remains over the first type of transistor and over the transistor region for the second type of transistor.

14. The method of claim 13, wherein the hard metal layer of the hard capping layer comprises tungsten (W), Niobium (Nb), or molybdenum (Mo).

15. The method of claim 13, wherein the barrier metal layer of the hard capping layer comprises a nitride.

16. The method of claim 15, wherein the barrier metal layer of the hard capping layer comprises titanium nitride (TiN), niobium nitride (NbN), or molybdenum nitride (MoN).

17. The method of claim 13, wherein:
the first type of transistor comprises an N-type transistor and the second type of transistor comprises a P-type transistor; and
the first work function metal layer comprises an N-type work function metal and the second work function metal layer comprises a P-type work function metal.

18. The method of claim 17, wherein the first work function metal layer comprises Titanium (Ti) and Aluminum (Al).

19. The method of claim 13, wherein the second work function metal layer comprises Titanium (Ti).

20. The method of claim 13, wherein the HK dielectric layer comprises: F, Cl, N, or O; and Hf or Zr.

* * * * *